(12) United States Patent
Lennon et al.

(10) Patent No.: US 9,373,731 B2
(45) Date of Patent: Jun. 21, 2016

(54) DIELECTRIC STRUCTURES IN SOLAR CELLS

(75) Inventors: Alison Joan Lennon, Rozelle (AU); Zhongtian Li, Kensington (AU); Stuart Ross Wenham, Cronulla (AU); Pei Hsuan Lu, Marsfield (AU)

(73) Assignee: NEWSOUTH INNOVATIONS PTY LIMITED, Sydney, NSW (AU)

( * ) Notice: Subject to any disclaimer, the term of this patent is extended or adjusted under 35 U.S.C. 154(b) by 145 days.

(21) Appl. No.: 14/128,465

(22) PCT Filed: Jun. 28, 2012

(86) PCT No.: PCT/AU2012/000764
§ 371 (c)(1),
(2), (4) Date: Mar. 26, 2014

(87) PCT Pub. No.: WO2013/000026
PCT Pub. Date: Jan. 3, 2013

(65) Prior Publication Data
US 2014/0199806 A1   Jul. 17, 2014

(30) Foreign Application Priority Data

Jun. 30, 2011 (AU) .............................. 2011902593
Aug. 2, 2011 (AU) .............................. 2011903131

(51) Int. Cl.
*H01L 31/00* (2006.01)
*H01L 31/0224* (2006.01)
(Continued)

(52) U.S. Cl.
CPC .... *H01L 31/022441* (2013.01); *H01L 21/2254* (2013.01); *H01L 31/02168* (2013.01); *H01L 31/056* (2014.12); *H01L 31/0682* (2013.01); *H01L 31/188* (2013.01); *H01L 31/1868* (2013.01); *Y02E 10/52* (2013.01); *Y02E 10/547* (2013.01); *Y02P 70/521* (2015.11)

(58) Field of Classification Search
USPC ...................... 136/252, 255, 256, 261; 438/98
See application file for complete search history.

(56) References Cited

U.S. PATENT DOCUMENTS 4,086,102 A * 4/1978 King ................. H01L 31/02168
136/244
4,234,352 A * 11/1980 Swanson .................... F24J 2/07
136/253

(Continued)

FOREIGN PATENT DOCUMENTS

CN          101359702       2/2009
WO     WO 2012/000015 A1    1/2012

OTHER PUBLICATIONS

Pei Hsuan Lu et al., "Enhanced Passivation for Silicon Solar Cells by Anodic Aluminum Oxide", Jun. 19-24, 2011, Proceedings of the 37th IEEE Photovoltaics Specialist Conference (PVSC), pp. 1490-1494.

(Continued)

*Primary Examiner* — Thanh-Truc Trinh

(57) ABSTRACT

A dielectric, structure and a method of forming a dielectric structure for a rear surface of a silicon solar cell are provided. The method comprises forming a first dielectric layer over the rear surface of the silicon solar cell, and then depositing a layer of metal such as aluminum over the first dielectric layer. The metal layer is then anodized to form a porous layer and a material layer is deposited over a surface of the porous layer such that the material deposits on the surface of the porous layer without contacting the silicon surface.

17 Claims, 19 Drawing Sheets

(51) Int. Cl.
  *H01L 21/225* (2006.01)
  *H01L 31/0216* (2014.01)
  *H01L 31/068* (2012.01)
  *H01L 31/18* (2006.01)
  *H01L 31/056* (2014.01)

(56) References Cited

U.S. PATENT DOCUMENTS

| | | | | |
|---|---|---|---|---|
| 5,053,083 | A * | 10/1991 | Sinton | H01L 31/03529 136/255 |
| 7,339,110 | B1 * | 3/2008 | Mulligan | H01L 31/022441 136/256 |
| 2005/0176164 | A1 * | 8/2005 | Gee | H01L 31/03529 438/48 |
| 2007/0020883 | A1 * | 1/2007 | Arias | H01L 21/027 438/455 |
| 2008/0035198 | A1 * | 2/2008 | Teppe | H01L 31/022433 136/256 |
| 2008/0072953 | A1 * | 3/2008 | Stephens | H01L 31/022441 136/249 |
| 2009/0236310 | A1 * | 9/2009 | Linder | B81C 1/00246 216/49 |
| 2010/0154876 | A1 * | 6/2010 | Camalleri | H01L 31/182 136/255 |
| 2010/0229936 | A1 | 9/2010 | Yago et al. | |

OTHER PUBLICATIONS

International Search Report and the Written Opinion of the International Searching Authority, PCT/AU2012/000764, issued by Australian Patent Office Aug. 24, 2012, 17 pages.

* cited by examiner

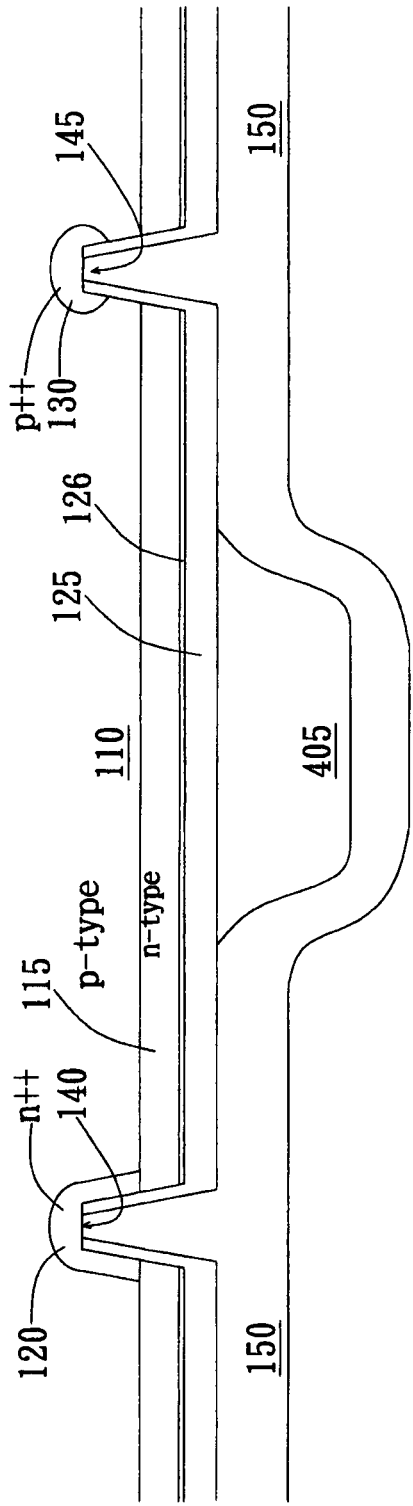
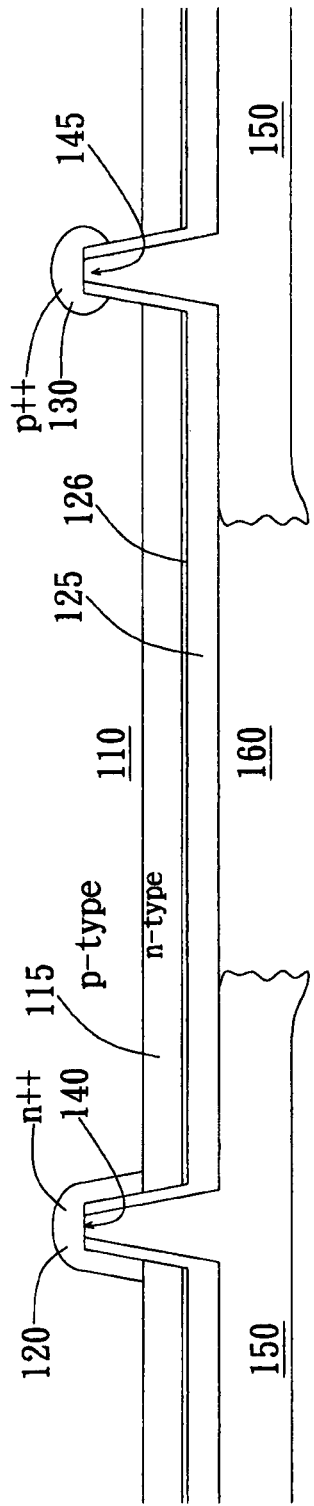
FIG. 4C
FIG. 4D

DIELECTRIC STRUCTURES IN SOLAR CELLS

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

TECHNICAL FIELD OF THE INVENTION

The present invention relates generally to the field of device fabrication and, in particular, to the formation of a structure that assists light trapping in solar cells.

BACKGROUND OF THE INVENTION

The fabrication of solar cell semiconductor devices typically involves the formation of metal contacts to a p-n junction device. The semiconductor material (e.g., silicon) absorbs light and generates electron and hole carriers which can then be separated by the p-n junction in the device. Majority carriers (e.g., electrons in n-type semiconductor material) are collected by the metal contacts which are formed to both the p-type and n-type material of the device. In commercially-produced screen-printed silicon solar cells, the n-type metal contacts are formed by screen printing and subsequently firing a silver paste in a grid pattern over the front (illuminated side) of the device. The p-type contact is formed by screen-printing the entire rear p-type surface of the device with an aluminium paste. This paste, when fired at temperatures of 780-870° C., forms a back-surface field (BSF) which reduces the recombination of the electron minority carriers (in p type material) at the silicon-metal interface and enables the collection of the hole majority carriers.

Screen-printed silicon solar cells have been industrially-produced for 25-30 years with continued improvements driving efficiencies towards 17-18% and 16-17% for mono-crystalline and multi-crystalline wafer substrates, respectively. One of the limitations of screen printed solar cells is that screen printed metal fingers formed on the illuminated surface of the solar cell effectively shade the cell and thus limit the generation of carriers in the cell. One way to address this issue has been to place all the metal contact regions on the rear surface of the cell. Such rear contact cells have been successfully manufactured, however although efficiencies as high as 24% have been achieved in a production environment, these rear contact technologies typically result in a higher cost per Watt of power generated than the less efficient commercially-produced screen-printed silicon solar cells. The higher cost of manufacture arises from the more complex processing required and the need to use higher quality silicon wafers to ensure that carriers generated towards the front (illuminated) surface of the solar cell can travel to a rear junction to be collected by the metal contacts.

Clearly what are required are new cost-effective manufacturing processes which can be applied to less-expensive, and potentially lower lifetime, silicon substrates in order to reduce the cell conversion costs of rear contact cells and make them more commercially competitive with existing screen-printed technology.

SUMMARY

According to one aspect a method of forming a dielectric structure for a rear surface of a silicon solar cell is provided, the method comprising:
i) forming a first dielectric layer over the rear surface of the silicon solar cell;
ii) depositing a layer of metal over the first dielectric layer; and
iii) anodising the metal layer to form a porous layer.

According to a second aspect a silicon solar cell is provided including a dielectric structure on a rear (non-illuminated) surface of the solar cell, the dielectric structure comprising:
i) a first dielectric layer over the rear surface of the silicon solar cell; and
ii) a porous layer of anodized metal over the first dielectric layer.

Preferably, a layer of material is subsequently deposited over a surface of the porous layer. The material deposited over the surface of the porous layer may seal the pores of the porous layer to trap air in the pores of the porous layer or alternatively the material may be deposited to extend into the pores as well as over the surface of the porous layer.

The first dielectric layer may cover a part or all of the rear surface of the silicon solar cell. Similarly the metal layer may cover a part or all of the dielectric layer.

The metal layer may comprise one of aluminium, titanium, magnesium, zinc, niobium or tantalum but will preferably comprises aluminium.

The first dielectric layer may comprise one or more of silicon dioxide, silicon nitride, silicon carbide, silicon oxynitride and amorphous silicon.

The layer of material deposited over the surface of the porous layer may comprise a dye, reflective particles or light scattering nanoparticles. The material deposited over the surface of the porous layer may further comprise a polymer encapsulant and the dye, reflective particles or light scattering nanoparticles may be loaded into the polymer encapsulant and the polymer encapsulant applied over the porous material and into the pores of the porous material. The layer of material deposited over the surface of the porous layer may also comprise a dopant source.

Alternatively the layer of material deposited over the surface of the porous layer may comprise a metal layer which is deposited over the porous layer and within the pores of the porous layer without contacting the silicon surface.

After formation of the porous layer it may be locally melted periodically at points where contact is to be made to the underlying silicon, whereby the porous layer and underlying first dielectric layer are disrupted and the underlying silicon is exposed and doped with aluminium. The disruption and doping is preferably performed with a laser.

When the material deposited over the surface of the porous layer is a metal layer, it may also form a metal contact layer which contacts the doped silicon via the disruption in the porous layer and underlying first dielectric layer. The metal contact layer may be formed to contact a base of a front junction solar cell, a rear junction solar cell or a rear junction solar cell.

The silicon solar cell may advantageously comprise a semiconductor substrate havening a thickness of less than 200 micron. The wafers used for this method will typically be in the range of 120-180 μm thick, and more preferably 150-160 μm thick. The method is particularly advantageous when the semiconductor device is a solar cell, particularly a rear junction solar cell.

Metal electrodes may also be formed to contact a plurality of semiconductor regions of the silicon solar cell, in which case the method further comprises:

i) depositing a polymer layer on the rear surface of the solar cell in a pattern corresponding to a desired metal isolation pattern;
ii) depositing the metal layer as a conductive metal contact layer over the rear surface to contact the plurality of semiconductor regions of the solar cell;
iii) processing the polymer layer to disrupt the conductive metal contact layer in the pattern of the polymer layer to isolate metal of the conductive metal contact layer contacting different ones of the plurality of semiconductor regions.

The step of processing the polymer layer may involve subjecting the device to ultrasonic excitation within a liquid. The polymer layer may be soluble in an organic solvent in which case the liquid will comprise the solvent, however the polymer layer may also be soluble in water in which case the liquid will comprise at least 10% water. The processing step may also involve heating the semiconductor device to soften or melt the polymer layer.

The polymer layer is preferably applied by a printing device, such as an inkjet printing device or an aerosol jet printing device.

The metal contact layer may be for example applied by sputtering or thermal evaporation and preferably comprises aluminium. The metal contact layer is preferably formed on a non-illuminated surface of the solar cell and contacts two semiconductor regions of two different semiconductor polarities of the solar cell.

According to a third aspect a method of forming an electrical contact for a solar cell device is provided, the method comprising:

a) forming a metal layer over the rear surface of the device;
b) selectively anodising regions of the metal layer to form at least one insulating region and at least one metal region, whereby the at least one metal region forms the electrical contact of the device.

The metal layer may be selectively anodised by covering the metal layer with a masking material that is resistant to an anodising solution used to anodise the metal. The covering material my be used to prevent areas of metal underlying the masking material from being anodised whereby the areas of metal underlying the masking material are retained as the at least one metal region. The masking material may be a polymer and may be deposited using a printing method comprising one of screen printing, inkjet printing or aerosol printing.

Alternatively, the masking material may be an inorganic dielectric comprising one of silicon dioxide, titanium dioxide, silicon nitride, silicon oxynitride, silicon carbide, or aluminium oxide. The inorganic dielectric layer is deposited as a layer and may be patterned using an etching process.

Isolating polymer lines may be deposited on the rear surface of the solar cell device before the layer of metal is deposited and then after the metal layer is formed the device may be processed to lift-off the metal above the polymer lines and thus form a plurality of isolated regions in the metal layer.

An anodic potential may be applied to a subset of the plurality of isolated metal regions during the anodisation process resulting in the at least one insulating region and the at least one metallic regions.

The method as claimed wherein the selective anodising step forms a plurality of metal regions separated by the at least one insulation region. The solar cell device may be a rear contact solar cell device in which case at least one of the plurality of metal regions may contact a p-type semiconductor region of the solar cell device and at least another one of the plurality of metal regions may contact an n-type semiconductor region of the solar cell device. The solar cell device may also comprise a plurality of photovoltaic devices, in which case the plurality of metal regions may comprise a metal region in contact with a p-type semiconductor region of one solar cell device and a n-type semiconductor region of an adjacent photovoltaic device to create a series connection of the adjacent photovoltaic devices. The metal layer may comprise aluminium, titanium, magnesium, zinc, tantalum, or niobium and preferably comprises aluminium.

In the case where the solar cell device is a silicon solar cell, an amorphous silicon passivating layer may be formed on the rear surface of the solar cell device before forming the aluminium layer over the rear surface of the solar cell device. After the selective anodisation step the aluminium and underlying amorphous silicon layer may be heated, where contact is required between the silicon solar cell and the remaining aluminium not anodized in the selective anodisation step, to cause metal induced crystallisation of the amorphous silicon.

The metal layer may be formed by printing using a colloidal metal ink. After printing the colloidal metal ink it may be fired to make it conductive.

According to a fourth aspect, a method of forming an anodised metal oxide layer on a surface of a semiconductor device is provided, comprising:

a) printing a metal layer using a colloidal metal ink;
b) firing the printed a metal layer to make it conductive; and
c) anodising the metal layer to form the anodised metal oxide.

The printed metal layer may be formed in a pattern by selectively printing the rear surface of the device.

The printed metal layer may cover an area of the semiconductor device where metal contacts are not required such that metal contacts are formed in areas not covered by printed metal or the anodised metal oxide. In this case a corrosive nickel ink may be deposited in the areas not covered by printed metal or the anodised metal oxide and the corrosive nickel ink may then be fired to create a nickel seed layer onto which metal contacts are plated.

The metal particles in the colloidal metal ink may be less than 2 um in diameter and may be printed using area aerosol deposition heads. The print head may print lines which are 0.5 to 3 cm wide and preferably 1.0 to 2.0 cm wide. The printing speed may be used to control the thickness of the deposited colloidal metal ink.

The colloidal metal ink may also be printed using screen printing or inkjet printing with appropriate adjustments to the viscosity of the ink.

After printing, the deposited colloidal metal ink may be sintered at a temperature between 150 and 500° C. and preferably at a temperature between 180 and 220° C. (nominally 200° C.).

BRIEF DESCRIPTION OF THE DRAWINGS

Embodiments of a solar cell rear contact and its method of formation will now be described, by way of example, with reference to the accompanying drawings in which:

FIG. 4C is a diagrammatic sectional side view of a portion of the device of FIG. 1A showing an isolation pattern formed by printing novolac resin using an aerosol jet printer.

FIG. 4D is a diagrammatic sectional side view of the portion of the device of FIG. 1A after the novolac resin layer has been removed to form an isolation pattern in an overlying metal layer.

FIGS. 18, 19, 20, 21 & 22 illustrate a method of forming patterned metallic and insulating/light trapping regions from a single layer of metal in a cell similar to the cell of FIG. 10 in which FIG. 18 shows a sectional elevation view of the first step of metal layer formation;

FIG. 19 shows the sectional elevation view of the device of FIG. 18 after a masking layer has been applied;

FIG. 20 shows the sectional elevation view of the device of FIGS. 18 & 19 after a masking layer has been selectively opened;

FIG. 21 shows the sectional elevation view of the device of FIGS. 18, 19 & 20 after a selective anodising step;

FIG. 22 shows the device of FIGS. 18, 19, 20 & 21 in plan view showing the metallisation and insulation pattern;

FIGS. 23, 24, 25, & 26 illustrate a method of forming metallic and insulating/light trapping regions from a single layer of printed metal in which FIG. 23 shows a sectional elevation view after the first step of printing a patterned metal layer;

FIG. 24 shows the sectional elevation view of the device of FIG. 23 after the printed metal layer has been fired to make the metal layer conductive;

FIG. 25 shows the sectional elevation view of the device of FIGS. 23 & 24 after a metal seed layer has been formed as a precursor to plating contacts to semiconductor regions of the device: and FIG. 26 shows the sectional elevation view of the device of FIGS. 23, 24 & 25 after an anodising step and plating of the contacts constrained by the anodised layer.

DETAILED DESCRIPTION OF EMBODIMENTS

Figure 1A:
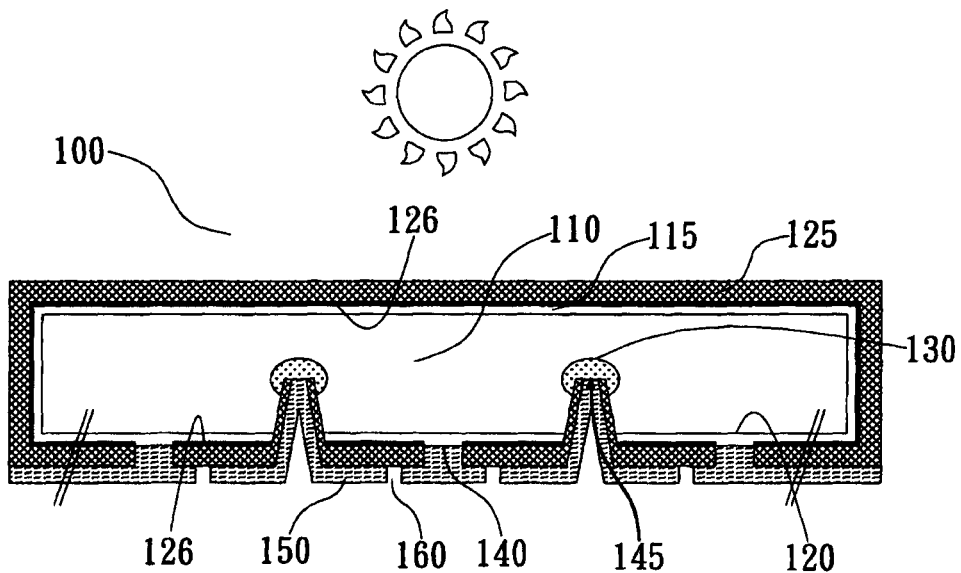
FIG. 1A is a schematic diagram showing a rear contact cell design.

Fabrication of low-cost solar cell devices requires processes which can minimise material usage and/or utilise, where possible, less expensive materials. For screen-printed solar cells, the cost of silicon wafers will continue to dominate the cost of devices even though large cost savings have been made in cell conversion costs over the past 5-10 years. Processes which can enable the use of thinner wafers can significantly reduce the cost of final devices. Furthermore, thinner wafers, if well passivated, can result in higher energy conversion efficiencies due to a reduction in the dark saturation current. The process of screen printing can result in high breakage rates as the wafer thickness reduces to values of ~160 µm and therefore this presents a limit to how thin wafers can ultimately be for the currently dominant patterning and metallisation process. If further gains are to be made with respect to using even thinner silicon substrates then alternative methods of patterning are required which place less stress on the substrates (i.e., contactless methods).

A further factor which currently limits cell conversion costs for screen-printed silicon solar cells is the cost of the silver metal used to form the front-metal contact grid. Currently the silver paste contributes ~40% of the cell conversion cost and this cost fraction may increase as the price of silver continues to increase partly due to demand driven by the increase in manufacture of screen-printed silicon solar cells. Clearly, this situation is not sustainable if photovoltaics are to provide an increasing fraction of the world's electricity needs in the future. The development of new low-cost technologies that use lower cost metals such as aluminum or copper would be advantageous. Aluminum is particular attractive due to its low cost (~US$2.60 per kg compared to >US$1000 per kg for silver), reasonably low resistivity ($2.65 \times 10^{-6}$ Ωcm at 20° C.), ready availability and ability to form a protective native oxide barrier.

However, aluminium's propensity to readily oxidize makes it more difficult to formulate into printable conductive inks that can be deposited using contact-free methods such as inkjet or aerosol printing. Consequently aluminium is typically best deposited using processes such as sputtering and thermal evaporation if contact of processing equipment with the substrate is to be avoided. Another potential issue with using aluminium to contact silicon directly is that silicon can diffuse into aluminum at reasonably low temperatures and cause aluminium spiking. This failure mode has been observed in integrated circuit devices, however it can be largely eliminated by adding small amounts of silicon to the aluminium (e.g., 0.5-2% and preferably ~1% Si).

A final strategy to reduce the cost of solar cells devices is to increase the efficiency of devices and thus increase the power output per manufactured device. In addition to reducing the cost per Watt of the module, the balance of systems costs is also reduced. Cell efficiency can be increased by attempts to minimise sources of loss. Current screen-printed solar cells can experience shading losses of 5-6% due to the presence of the metal grid on the illuminated surface of the cell. By placing both polarity metal contacts on the rear surface these losses can be avoided. However, typically solar cell devices which employ a rear junction to collect the light-generated carriers have needed to use higher quality and therefore more expensive (higher-lifetime) silicon wafers in order to enable carriers generated at the illuminated side of the cell to travel to the rear surface to be collected.

Some cell design technologies, such as emitter wrap-through (EWT) or metal-wrap-through (MWT), attempt to address this problem by either having the rear emitter layer or the rear metal layer of the solar cell wrapping through the device to the front surface in order to more effectively collect carriers. The "wrapping" is typically achieved using a laser to form holes or grooves which extend from the back to the front of the solar cell. To some extent these technologies have enabled rear metal contacting of cells fabricated on commercial-grade silicon wafers, however neither of the technologies have been widely adopted for commercial manufacture to-date most likely due to their resulting efficiency gains being insufficient to warrant the increased complexity of the manufacturing process. Furthermore, cost-effective implementations of EWT and MWT technologies often employ screen-printed metallisation and therefore are limited to wafer thickness above 160 μm.

However, some manufacturers (e.g., SunPower) have demonstrated that efficiencies exceeding 24% can be achieved in a manufacturing environment with a rear emitter, rear contact cell design which does not require extensive laser patterning in order to enable the capture of carriers generated close to the front surface. Instead they use high-lifetime silicon substrates, good surface passivation, and well-engineered ohmic contacts to achieve high efficiencies in commercial production. However this comes at a cost and the cost per Watt of produced cells still significantly exceeds that of current commercially-produced screen-printed cells.

A large advantage could be obtained if processing techniques could be developed to enable higher minority effective carrier lifetimes to be achieved using lower-quality commercial-grade silicon substrates. If cell thicknesses are reduced then the criticality of ensuring good surface passivation increases. Using dielectrics such as silicon nitride and silicon oxynitride, which are routinely deposited using plasma enhanced chemical vapor deposition (PECVD), n-type silicon surfaces can be well passivated with surface recombination velocities less than 100 cm/s being reported. The low surface recombination velocities are largely due to the formulation of an accumulation layer in the n-type silicon formed because of the existence of stored positive charges in the dielectric layer. This accumulation layer serves to repel minority carrier holes from the surface and therefore minimise surface recombination. Typically, p-type silicon is more difficult to passivate because the minority carriers are the more mobile electrons and hence are more difficult to eliminate from surface regions, although dielectrics such as aluminium oxide have been shown to passivate these surfaces well. Also dielectric layers such as silicon nitride and silicon oxynitride deposited onto p-type silicon can result in the formation of inversion layers which can minimise surface recombination due to the very low hole concentration at the surface, however forming metal contacts to p-type silicon through such layers can be difficult due to shunting between the inversion layer and the metal contact.

A further advantage of placing both polarities of metal contacts on the rear surface is that the cell interconnection process can be simplified. For commercially-produced screen-printed solar cells, interconnections must be formed from the n-type contacts on the illuminated surface to the p-type contacts on the rear surface. This necessitates the interconnect wire being looped between the front and rear surfaces, placing limitations on how closely individual cells can be placed in a module and resulting in possible shunting if the interconnect wire comes into contact with the side of the cell. Interconnection becomes more straightforward if both polarity contacts are on the rear surface and therefore, although new rear contact strategies such as EWT and MWT may offer only modest improvements in cell efficiency over screen-printed cells, further cost benefits may result during module fabrication.

Many rear-contact cell designs employ n-type wafers due to their higher minority carrier lifetimes, however most advances that are occurring in lower-cost wafer manufacture are being applied to boron-doped substrates. Boron, unlike phosphorus, has a high segregation coefficient and therefore large variations in resistivity do not occur as crystals grow. An example of new wafer substrate technology that will most likely result in lower-cost and potentially higher lifetime p-type wafers is the cast mono-silicon technology where substantially mono-crystalline silicon can be grown in a cast similar to the way in which multi-crystalline ingots are currently gown. The resulting p-type silicon does not contain the same high levels of oxygen that exist in CZ p-type monocrystalline silicon and so higher minority lifetimes are possible due to the absence of boron-oxygen defects. The use of p-type wafers is also preferable for commercial production because an emitter can be formed using the safer and more established process of phosphorus diffusion. Boron diffusions require the use of toxic gases such as boron tribromide, higher diffusion temperatures and require careful process control for reproducible results.

For the above reasons the preferred arrangement for the current fabrication process uses p-type wafers, though clearly similar low-cost, low-waste, low stress (or touch free) processes could also be applied to n-type wafers. FIG. 1A schematically illustrates a device 100 incorporating a first rear contact design. A p-type wafer 110 of resistivity 1-3 Ωcm is enshrouded with an n-type diffusion, which has a sheet resistance of 100-300 Ω/sq (ohms/square) and more preferably, 150-200 Ω/sq on the front surface 115 and ~25 Ω/sq on the rear surface 120. Although not depicted in FIG. 1A for simplicity, both the front and rear surfaces of the wafer are textured to reduce reflection and enhance light trapping within the cell. The lightly-doped front surface layer 115 forms a floating junction which acts to reduce recombination at the front surface by reducing the concentration of holes at that surface. Under illumination this floating junction becomes forward-biased and injects electrons into the p-type bulk where they diffuse down a concentration gradient to the rear-surface n-type metal contacts.

Grooves in the rear surface contact a heavily-doped p-type region 130 that is formed only at the base of the grooves. A dielectric layer 125, preferably comprising silicon nitride, is formed on both the front and rear surface of the wafer to a thickness of 70-80 μm and preferably 74-76 nm. In a variation of the preferred cell design the silicon nitride layer is deposited over a thin silicon dioxide layer 126 of thickness 10-15 nm. The silicon nitride dielectric layer provides excellent surface passivation for the entire n-type surface.

Openings are then formed in the dielectric layer 125 to expose heavily-doped n-type silicon 140 and heavily-doped p-type silicon 145. To increase processing throughput these openings are preferably groove openings having a width of 15-30 μm and more preferably ~20 μm. Alternatively, these openings can be hole openings to further reduce the metal-silicon interface area. A layer of aluminium is then deposited over the entire rear surface to form metal contacts via the formed openings. The n-type and p-type contacts are isolated from each other using a lift-off technique to create openings 160. This isolation technique is described in more detail below with reference to FIGS. 2, 3 & 4A to 4F.

Figure 1B:
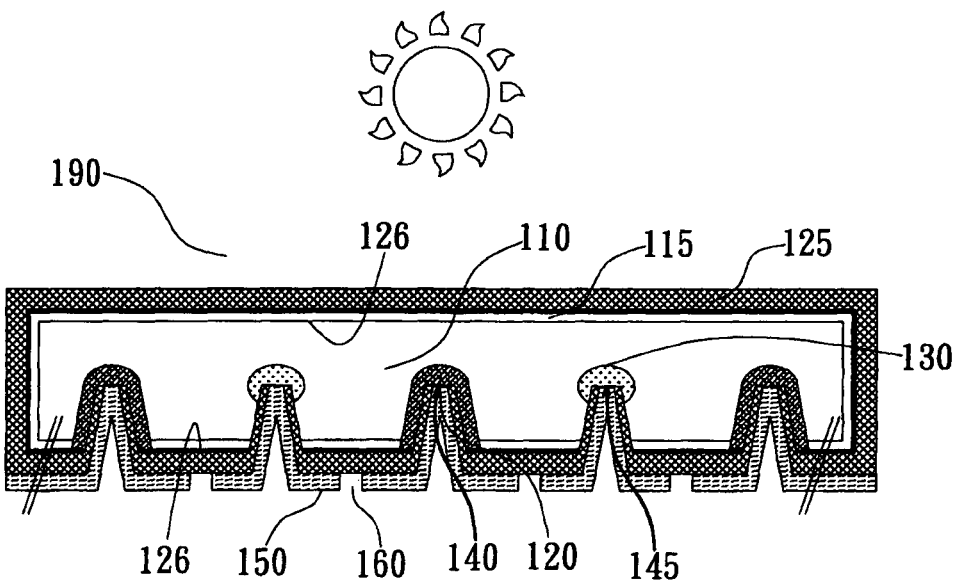
FIG. 1B is a schematic diagram showing a variation of the rear contact cell design of FIG. 1A in which grooves are patterned prior to a first diffusion process.

FIG. 1B depicts a variation of the cell design 100 where grooves are first patterned through a masking oxide layer such that the phosphorus diffusion process results in heavily-doped n-type silicon (i.e., 25 Ω/sq sheet resistance) only within the grooves and a lighter diffusion elsewhere. This variation has the advantage that it removes the heavily-doped layer from the rear surface (resulting in reduced dark saturation current) and places the n-type contacts closer to the front surface floating junction thus reducing the distance that the minority carriers must travel to be collected. However, these advantages are obtained at a cost of additional processing which is discussed further below with reference to FIG. 5.

The preferred arrangement will now be described with reference to the process flow 200 in FIG. 2. Wherever possible, wet chemical and diffusion processes are performed as currently done in commercial production of screen-printed solar cells. Incoming wafers, which are preferably <100> p-type wafers, are textured in step 205 using a texturing process such as the alkaline texturing process currently used in the manufacture of mono-crystalline screen-printed silicon cells. The wafers can be pseudo square commercial-grade p-type. CZ silicon wafers, or more preferably good quality cast mono-crystalline square wafers. The wafers are preferably 120-180 μm thick, and more preferably 150-160 μm thick. Alternative texturing processes, such as acidic texturing can also be used in step 205.

After cleaning using a standard metal clean in 2% HF and 4% HCl and a rinse in deionised water, the wafers are subjected to phosphorus diffusion in step 210. Preferably, the phosphorus diffusion is performed using a POCl furnace, with the wafers being placed in the boat so as to only lightly-diffuse the front surface to ~120-300Ω/sq, and more preferably 150-200 Ω/sq, while heavily-diffusing the rear surface to 15-45 Ω/sq (or approx. ~25 Ω/sq). After diffusion, the phosphorous is driven-in during a wet thermal oxidation step (step 215), resulting in a silicon dioxide layer of thickness ~200 nm. Alternatively, an in-line belt diffusion process can be used to perform the phosphorus diffusion.

In step 220 grooves are etched in the rear surface using a low-temperature patterned etching step such as described in PCT Publication WO2009/094711 (PCT/AU2009/000098) "Method for patterned etching of selected material", where locally-formed HF etches the silicon dioxide to leave openings in the dielectric layer. Preferably, the acid source for this process is provided by first non-contact printing an acidic water soluble polymer such as polyacrylic acid (PAA) and then overprinting the fluoride source. Both printing steps can be achieved using a fluid deposition device such as an inkjet printer or an aerosol jet printer, although use of an aerosol printer is preferred because of the ability to remove a larger amount of the solvent during the deposition process. This is particularly advantageous for the printing of the PAA where additional solvent (water) can cause spreading of the deposited aerosol when it contacts the silicon dioxide surface.

For the PAA deposition, an ultrasonic atomizer is preferably used with a transducing voltage of 45 V and atomizer temperature of 25° C. to atomise a 5% (w/v) solution of PAA in water. A single pass using a 200 μm deposition tip can be used to deposit lines of dried PAA on the silicon dioxide surface of the wafer which is held by vacuum to a platen heated to between 50 and 60° C., and more preferably 55° C. Preferably the atomizer and sheath flow rates used are 15-25 and 20-25 cm$^3$/minute (ccm), respectively, although other higher aerosol flow rates can be used if more. PAA is required to be deposited. Higher sheath flow rates can be used to constrain the PAA printed line width and thus enable narrower etched lines. The process velocity used is between 5 and 15 mm/s, and more preferably 10 mm/s.

The fluoride source is provided by a 10% (w/v) ammonium fluoride solution which is also atomized using an ultrasonic atomizer with a transducing voltage of 40 V and atomizer temperature of 25° C. The deposition of the fluoride source is aligned by point and line registration to the printed PAA and preferably 2 printing passes are made using a 100 μm deposition tip while the wafer is held to the platen which is heated to between 40 and 60° C., and more preferably 50° C. Preferably the atomizer and sheath flow rates used are 15 and 10 ccm, respectively, although as described for the PAA deposition these flow rates can be varied to achieve different deposition properties. Furthermore different deposition tip sizes can also be used to deposit more or less aerosol if required.

Deposition of the polymer and fluoride sources can be achieved on one printing station where the wafers are transported from the polymer to the fluoride printing head assembly using a wafer transport system comprising a moving belt platen. Each printing head assembly can comprise an array of nozzles with the nozzle spacing corresponding to the spacing (pitch) of the required grooves. Preferably, all the nozzles are connected to a single atomiser unit and aerosol and sheath gas flows are maintained constant for all the nozzles in the array. Alternatively, each nozzle can be supplied by its own atomiser unit and parameters for each atomiser units can be individually controlled. The latter arrangement has advantages for variations where different patterning may be desirable across individual wafers. For example, if wider grooves are desired then higher aerosol flow rates can be used.

In order to achieve wafer processing throughputs of 1500 or 3000 wafers per hour, respectively, multiple printing lanes each with their own printing head assemblies can be arranged. Each printing lane has its own automated wafer loading system which places wafers on the moving vacuum platen. Software-controlled visual alignment systems are used to register the location of placed wafers and adjust the position and alignment angle of the deposition head assembly with respect to the wafer.

After deposition has been completed the wafers are rinsed in deionised water for 5 mins. This rinse step is preferably performed in a separate inline rinse step. A key advantage of the patterning process 220 is that because small amounts of PAA and fluoride are used in the patterning process the concentration of these chemicals is very low in the rinsing bath enabling long rinse bath lifetime and reduced waste management. The concentration of fluoride in the bath can be managed and maintained below 5 ppm enabling the minimal waste treatment as the bath is constantly bled and re-filled.

In a variation to the preferred process, the acidic polymer can be spin-coated or spray-coated over the entire wafer surface to be patterned to form a dried polymer layer which is between 1 and 2.5 μm, and more preferably between 1.5 and 2.0 μm thick. Although this variation can increase processing throughput, it has the disadvantage of using more polymer than is strictly required by the etching process. It also can result in shorter rinse bath lifetime.

Ideally the acid and fluoride deposition conditions are varied to achieve etched line widths of 50-120 μm and more preferably of 65-75 μm. While the silicon dioxide mask is still in place, the silicon at the base of the grooves is preferably etched in 20% (w/v) KOH for 20 mins at 80° C. to etch grooves which are 25-35 μm deep and 20-75 μm wide, and more preferably 15-30 μm wide, at the base of the grooves. Acidic etching in solutions comprising an oxidant (such as nitric acid) and hydrofluoric acid can also be used to form the grooves, however the isotropic nature of these etchants can result in more "balloon" shaped grooves. The tapered grooves that result from the use of anisotropic alkaline etchants can help constrain the etching (by directing the flow of deposited aerosol) when openings are made through the dielectric layer in step 245 of process 200.

These grooves enable the base metal contact for the solar cell, however they also eliminate potential shunting between the n-type emitter at the rear of the cell and the base contact and enable clear alignment features when opening the dielectric within the heavily-doped regions in step 245. A common problem experienced with interdigitated rear contact cells is shunting between the n-type and p-type regions. This problem is of particular concern when a heavily-doped region of one polarity is required to be formed through an emitter layer of the other polarity as the doping process has to compensate and overwhelm the presence of the other polarity dopant. By displacing the heavily-doped p-type region away from the rear surface emitter this problem can be effectively eliminated.

Doping of the regions at the base of the grooves is preferably achieved by printing lines of aluminium ink (such as provided by Applied Nanotech) and sintering at temperatures exceeding the eutectic temperature of aluminium of 577° C. Preferably a spike fire is performed with a temperature of 750-800° C., and more preferably 775-785° C. being maintained for 1 min. Fast ramp down times will prevent aluminium diffusion from the p+ regions formed during cooling of the molten alloy. In a variation to this doping process, washed and dried fine aluminium wire containing 0.5-2% (preferably ~1%) silicon and having a diameter of 20 μm can be placed in the formed grooves and fired in essentially the same way as described above for the aluminium ink. Cassette-mediated methods of loading the grooves with the cleaned, pre-cut fine wire can enable fast throughput, however care must be taken to ensure that the wire is maintained straightened else misalignment can occur.

With both the aluminium ink and the fine aluminium wire approaches to p+ doping at the base of the grooves, un-reacted aluminium can optionally be removed before proceeding to step 235 of process 200 by immersing wafers in a solution comprising 10% hydrochloric acid for durations of 1-2 mins depending on the volume of metal deposited in the grooves. This further treatment ensures that only the p+ silicon remains in the grooves and therefore smaller metal silicon contact areas can be achieve in step 245 of process 200.

The p+ doping can also be achieved by printing solutions containing doped silicon nanoparticles such as those produced by companies like Innovalight. These inks can be doped with any p-type dopant and so high doping levels can be achieved. Aluminium has a limited solid solubility in silicon so doping achieved by aluminium alloying processes as described above are limited to achieving dopant levels of ~$2\times10^{18}$ cm$^{-3}$. Heavier doping of the p-type region results in increased tunneling at the metal semiconductor interface and hence lower contact resistance. The doped silicon nanoparticles can be printed using a range of fluid deposition devices included inkjet and aerosol jet printers. Industrial printing devices enable accurate registration of printing with features on the substrate (typically within 5-10 μm) and the patterned grooves are clearly visible as registration features in alignment cameras typically used for these devices.

In a further variation to the doping process in step 230, a boron diffusion process can be performed in a diffusion furnace to form the p+ regions. Wafers must be diffused for ~1 hour at 900° C. and then the dopants driven in for up to 2 hrs at 1050° C. in order to form very heavily-doped p+ regions. Although able to form a heavily-doped uniform p+ layer, the boron diffusion is undesirable because of the need to use such high temperatures which is undesirable for maintaining reasonable minority carrier lifetimes in lower-quality silicon materials.

In yet another variation to the p-type doping process, a layer of aluminium can be deposited (e.g., by thermal evaporation or sputtering) over the rear surface and fired substantially as was described for the Al ink. The patterning oxide layer which is formed in step 215 provides a barrier to aluminium and silicon diffusion over the rear surface and so aluminium alloying only occurs in the regions of the openings in the oxide layer 145. The aluminium layer is then removed as described for the oxide layer below.

The formation of a p+ region at the base of the grooves is essential for ensuring low contact resistance. If the p-type silicon is doped to a level exceeding $10^{18}$ cm$^{-3}$ then significant tunneling can occur through the metal-semiconductor barrier enabling ohmic contact. As the dopant concentration approaches $10^{19}$ cm$^{-3}$ then charge transport becomes dominated by tunneling and the specific contact resistivity can fall to values of ~$10^{-6}$ Ωcm$^2$. If cell performance is to be enhanced by reducing the area that metal (aluminium in this case) contacts the silicon then the criticality of low specific contact resistivities increases.

After the formation of p+ regions at the base of the grooves, in step 235 the masking silicon dioxide is removed by immersing the cell in a buffered oxide etch or dilute HF solution. A dielectric layer 125 is deposited in step 240. In the preferred arrangement, a silicon nitride layer is deposited using PECVD onto a cleaned silicon surface. Preferably the silicon nitride layer has a thickness of ~75 nm and a refractive index of ~2.0. In a variation to this process, the silicon nitride layer can be deposited over a thin silicon dioxide layer which has been formed using either a thermal oxidation process, a wet chemical process involving immersion in sulphuric acid solutions or azeotropic nitric acid solutions (substantially as described in "Nitric acid pretreatment for the passivation of boron emitters for n-type base silicon solar cells" by Mihailetchi et el. in Appl. Phys Lett., 92, 063510, 2008) or by a PECVD deposition.

Surface recombination is an important factor in the cell design and surface recombination velocities of, less than 100 cm/s are desirable. In addition, to providing excellent surface recombination via reducing surface state defects and formation of an accumulation layer in the n-type layer, silicon nitride deposited by PECVD is rich in hydrogen that can help passivate impurities and crystal impurities in the bulk of the wafer on annealing. The silicon nitride is preferably deposited at a temperature of 400° C. and is subsequently annealed at 680° C. for 10 mins in forming gas (5% $H_2$ in $N_2$ or Ar).

The formation of all the heavily-doped p-type and n-type regions before the deposition of the passivating dielectric layer is advantageous in that hydrogen that is introduced into the cell as part of the passivation layer deposition is not driven out by subsequent high-temperature processes. Hydrogen is extremely mobile in silicon and even local high temperature treatments, such as laser-doping, can impact significantly on the hydrogen passivation achieved from hydrogen-rich layers deposited by PECVD. As a result, very high minority carrier lifetimes and hence open circuit voltages can be achieved in final devices. These high lifetimes are especially important for rear contact devices because they enable minority carriers to diffuse to the rear emitter for collection and hence minimise the requirement to use very high quality substrates.

In step 245, openings are etched in the dielectric layer 125 using the patterned etching method described earlier for step 220. In this patterning process, groove or hole openings as narrow as 10-30 μm and more preferably ~20 μm are etched in the dielectric layer 125 for n-type (140) and p-type (145) metal contacts. Although hole openings can reduce the metal-silicon interface area and hence the dark saturation current of the final device, they are more difficult to achieve at industrial throughput rates so groove openings are preferably used.

Since the dielectric layer 125 is only 75 nm thick openings in this layer can be achieved in two fluoride printing passes. A single deposition head assembly can print the etching pattern for each of the n-type and p-type openings, with a second identical deposition head assembly printing the second pass. Following etching, wafers are rinsed as described for step 220.

The final steps enable the formation of low-cost aluminium metal contacts through the formed openings for each of the embodiments described herein. Isolation of the n-type and p-type contacts is achieved using a lift-off technique. First in step 250 a polymer 405 (in FIG. 4C) is printed according to an isolation pattern 350 (as shown schematically in FIG. 3) on the rear surface of the cell. The rear surface of the solar cell 300 is shown with regions exposed in the dielectric 125 for n-type contacts 310 and p-type contacts 320. The isolation pattern 350 is printed such that all the connected n-type regions are isolated from all the connected p-type regions. The isolation pattern 350 is positioned where a discontinuity in a rear aluminium layer would be required in order to effect electrical isolation of the n-type and p-type contacts. In the preferred arrangement the pitch between each of the n-type (and also each of the p-type grooves) is between 0.5 and 2 mm and more preferably 1 mm. Though clearly other pitch values can also be used with closer spacing being advantageous in variations where a more lightly-doped emitter layer 115 is employed.

Preferably, the polymer that is used is a novolac resin dissolved in a high vapor pressure solvent such as sulfolane at a concentration of 1 to 12% (w/v), and more preferably 3-5% (w/v). The polymer can be printed using any non-contact printing devices (e.g., drop-on-demand and continuous inkjet printers, aerosol jet printer, and jetting/dispensing devices used for dispensing of high viscosity materials such as pastes and adhesives), however due to the use of aerosol jet printing technology in other steps, the preferred arrangement employs that technology for the printing of the isolation pattern. Deployment of a limited number of different technologies enables manufacturers to develop expertise in those technologies and be more effective at maintaining and refining processes with time.

The isolation pattern can be represented by a single tool path which can be printed/dispensed very quickly preferably in a single pass. The width of the printed polymer is preferably 70-200 μm and more preferably ~100 μm wide to ensure reliable lift-off performance. In general, the maximum necessary height of the printed isolation pattern is between 1-2 times the thickness of the metal layer that is to be isolated provided that the printer surface is not highly textured. Isolating metal layers on wafers having texture patterns with large differences in feature sizes (e.g., alkaline texturing with large pyramid sizes or remaining saw-damage marks) makes it desirable that the height of the printed polymer be ~5 times higher than the thickness of the metal layer.

The novolac resin is preferably dispensed using a pneumatic atomizer of an aerosol printer with sheath, aerosol, and impact exhaust flow rates of 30, 1930 and 1900 ccm, respectively. However, other deposition settings can also be used in order to achieve printed lines with the appropriate shape to enable sufficient lift-off. The platen temperature is maintained at between 90 and 150° C., and more preferably 120° C. in order to evaporate solvent from the printed lines after deposition. Using these deposition conditions, dried polymer lines of width 100-150 μm and height 1 to 20 μm can be formed depending on the number of layers deposited. Deposition of 2 layers of 4% (w/v) novolac resin in sulfolane using a deposition speed of 2 mm/s results in dried polymer lines 405 of 110-120 μm width and 6 μm maximum height on an alkaline textured wafer surface, as shown in the surface profile illustrated graphically in FIG. 4A and diagrammatically in FIG. 4C. Deposition of further layers can result in thicker lines an easier (i.e., quicker) aluminium lift-off.

Other resins or polymers can also be used with a range of different solvents. If the polymers are jetted using a printing device such as an aerosol jet printer, then preferably high vapor pressure solvents are used in order to prevent excessive drying of particles which can result in overspray of aerosol particles at the edges of the printed lines. Hot melt waxes can also be used, provided that they can be reliably dispensed on the surface according to the isolation pattern. Hot melt waxes have been successfully dispensed by inkjet printers for selective emitter patterning for silicon solar cells by inkjet printing systems such as manufactured by Schmid.

Water soluble polymers, such as PAA, can also be used to form the isolation pattern with water being used as the solvent. The water solubility of these polymer systems is advantageous with respect to waste management, however typically a larger number of layers are required in order to form a dried polymer line 406 of sufficient height for lift-off. Furthermore these polymers can result in dried polymer lines which exhibit high outer ridges regions with a central valley/depression due to the movement of the deposited polymer molecules to the edge of the printed lines where evaporation is enhanced (see the surface profile illustrated graphically in FIG. 4B and diagrammatically in FIG. 4E). The profile of the printed lines can be varied to minimize this effect by increasing the platen temperature and also "drying" the aerosol further (e.g., by using lower aerosol flow rates and higher sheath gas flow rates) to eliminate excess solvent. However, the shape of the printed polymer profile does not appear to affect the lift off significantly as long as the maximum height of the printed line is sufficiently high to initiate the lift-off process.

Polyacrylic acid can be deposited as the lift-off polymer using the printing conditions outlined previously. When a 1% (w/v) PAA solution is atomized as described for step 220 and deposited on an alkaline textured surface maintained at a temperature of 50° C., dried polymer lines with profiles as shown in FIG. 4B and FIG. 4E result. On average, the dried polymer height at the edges and centre of the deposited lines is ~6 µm and 3.5 µm, respectively. No further heat treatment is required for the dried polymer lines. The printing of further layers results in the shape of the printed lines becoming higher and more parabolic. Once 10 layers of the isolation pattern are deposited the line profile is parabolic and the lines are 10-12 µm high.

Figure 3:
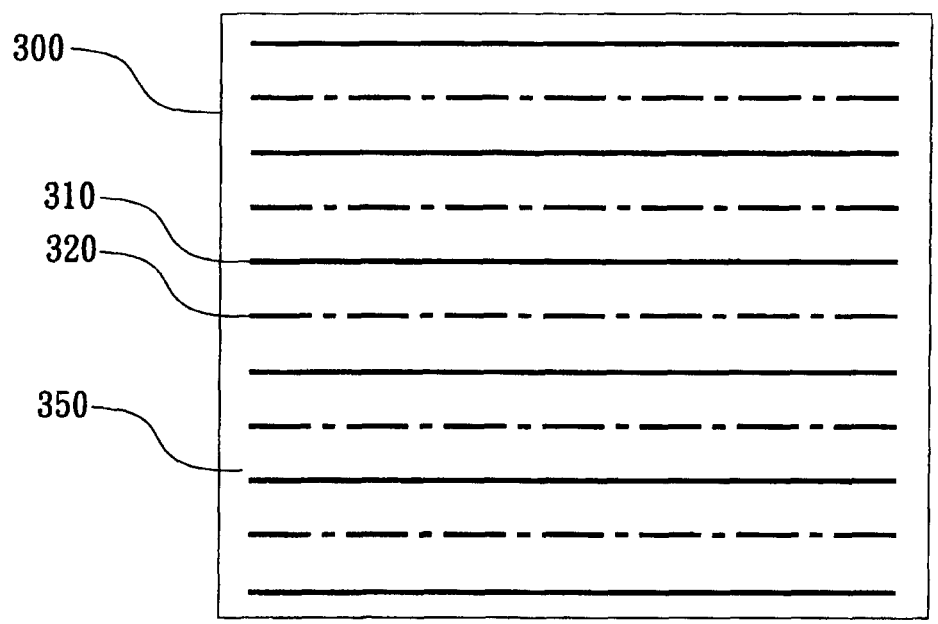
FIG. 3 is a schematic showing the placement of the isolation pattern with respect to the p-type and n-type openings on the rear surface of the design of FIG. 1A.

In step 255, aluminium layer 150 is then either thermally-evaporated or sputtered over the entire rear surface including over the printed isolation lines 310, 405, 406. Preferably, an aluminium layer 150 having a thickness of 1-3 µm and more preferably 1.0-2.5 µm is formed. The deposited aluminium layer 150 needs to be sufficiently thick to ensure that series resistance of the metal contacts is sufficiently low. Clearly thicker layers may be required for larger wafers, especially if the contacting pattern shown in FIG. 3 is used. This aluminium layer contacts both the heavily-doped n-type silicon 120 and the heavily-doped p-type silicon 130 via the openings 140 and 145, respectively. Depending on the way in which interconnection is achieved for the cells when they are incorporated into modules, it can be necessary to increase the aluminum thickness in the busbar (side) regions of the cell's n-type and p-type metal contacts. These regions will effectively carry the current for entire cell and so resistance in these regions must be minimised to maximise cell and module efficiency.

In order to prevent aluminium spiking, which is caused by the diffusion of silicon into the aluminium at relatively low temperatures, preferably 0.5 to 2% and more preferably ~1% silicon is added to the aluminium that is evaporated or sputtered over the surface. The small amount of added silicon does not alter the conductivity of the aluminium layer significantly, with the resistivity reducing by 0.7 µΩcm for 1% added silicon. If further safeguards against aluminium spiking are required (e.g., if final devices are to operated at higher temperatures) then a diffusion barrier layer comprising a silicide, nitride, carbide or a combination thereof can be deposited before aluminium deposition.

For example, the specific contact resistivity for aluminium contacts to heavily-doped silicon can reduced to values less than $10^{-6}$ $\Omega cm^2$ by using a nickel silicide intervening layer. Before Ni deposition by sputtering, wafers are immersed in 1% hydrofluoric acid for 20 s to remove any native oxide in the openings. A layer of nickel of thickness of ~50 nm is then sputtered over the rear surface from a 99.99% pure sputtering target and then subsequently annealed at 350° C. for 2 to 20 mins and more preferably 5 mins. Aluminium is then deposited by sputtering or evaporation. Un-reacted nickel can optionally be removed by immersion in a 20-35% (w/v) solution of nitric acid before aluminium deposition.

In the preferred arrangement, where the polymer lines comprise dried resin 405, cells are sonicated in an ultrasonic bath using a frequency of ~40 kHz in for 10-15 mins in acetone at 20-25° C., to remove the aluminium formed over the isolation pattern formed by the dried resin lines 405 to create isolation openings 160 (see FIG. 4D). Preferably cells are arranged in a polypropylene cassette and oriented parallel to the base of the ultrasonic bath during the sonication process. They are then rinsed in deionised water for 5 mins to remove all traces of acetone and aluminium particles before being dried in readiness for cell testing and interconnection. Aluminium can be readily reclaimed from the sonication waste. This reclaiming of aluminium is especially straight-forward when water-soluble polymers (e.g., such as PAA) are used for forming the isolation pattern.

Shorter sonication times can be employed by either forming thicker polymer lines or using less-textured surfaces. For example, for an acidic textured silicon surface 100% removal of 1.5 µm thick aluminium over the isolation pattern can be readily achieved by printing a single layer of resin and sonicating in acetone at 20-25° C. for 10-15 mins. Due to the reduced processing costs of the in-line acidic texturing compared to batch alkaline texturing, many manufacturing companies are selecting to use acidic texturing for alkaline wafers even though it results in higher reflectance values. In the case of the described rear contact cells in the below-mentioned variations 3 to 5, where a rear anodic aluminium oxide layer is employed for enhanced light trapping, use of acidic textured does not result in significant reduced cell open circuit current because: (i) much of the light reflected from the front surface of the ARC is re-directed back into the cell when the cell in encapsulated into a module; and (ii) the rear surface reflector in these below-mentioned variations provides for enhanced light trapping for light not absorbed in its first pass through the cell.

Lift-off can be achieved with hot melt waxes by simply heating the wafers to temperatures sufficient to melt the wax (e.g., ~80° C.) and then rinsing in a solvent for the wax. Heat treatments can also be employed to assist lift-off for some resins. In these cases it is advantageous to ensure sufficient amounts of solvent are deposited with the resin to ensure that a sufficient vapor pressure forms during the heating step to initialise the lift-off process. For these approaches, high vapor pressure solvents are preferable.

Figure 4A:
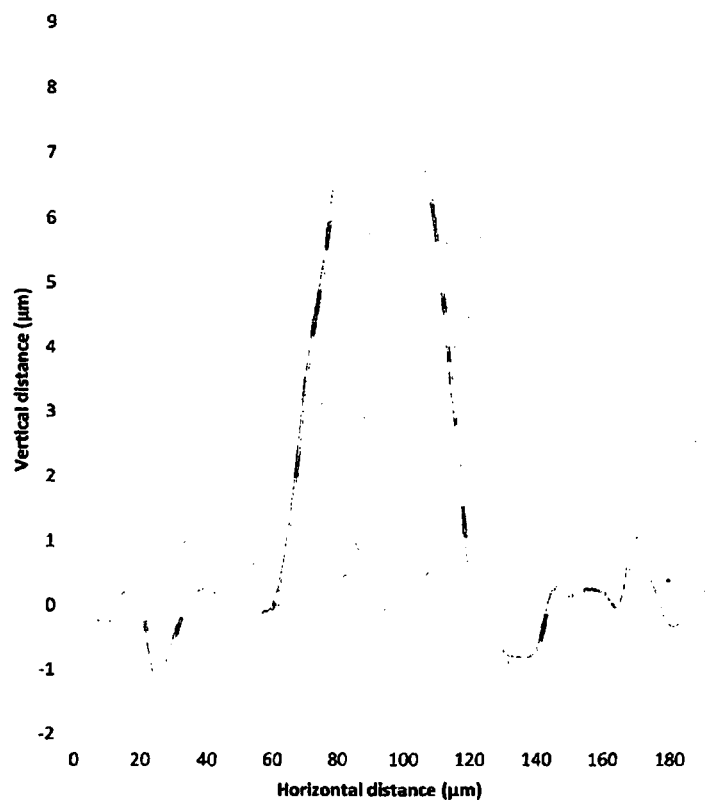
FIG. 4A is a graphical representation drawn from a Dektak profile of a section of an isolation pattern formed by printing a novolac resin using an aerosol jet printer.
Figure 4B:
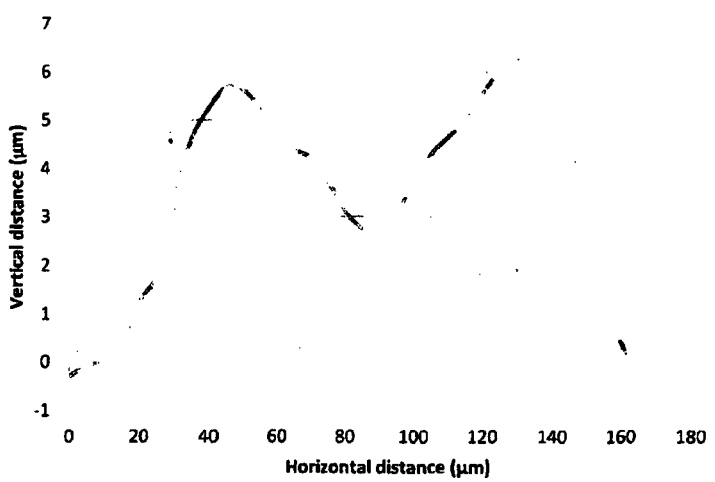
FIG. 4B is a graphical representation drawn from a Dektak profile of a section of an isolation pattern formed by printing a water soluble polymer, such as polyacrylamide (PAA), using an aerosol jet printer.
Figure 4E:
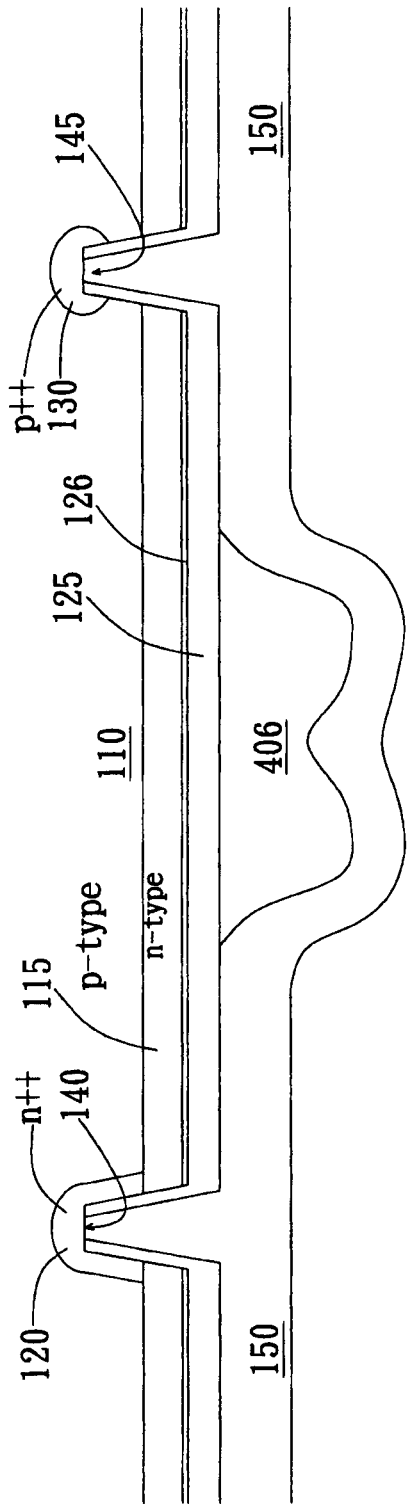
FIG. 4E is a diagrammatic sectional side view of a portion of the device of FIG. 1A showing an isolation pattern formed by printing a water-soluble polymer, such as PAA, using an aerosol jet printer.
Figure 4F:
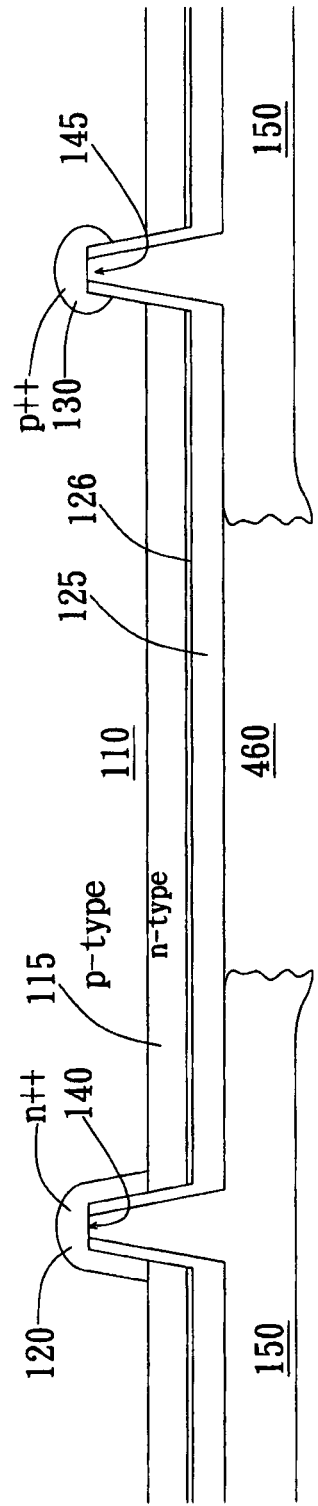
FIG. 4F is a diagrammatic sectional side view of the portion of the device of FIG. 1A after the water-soluble polymer layer has been removed to form an isolation pattern in an overlying metal layer.

Lift-off for water soluble polymers to create the isolation openings 460 in FIG. 4F is very straight-forward generally requiring only sonication in deionised water at 20-25° C. for 10-15 mins. Successful lift-off (i.e., 100% of aluminium above the isolation lines) can be achieved for acidic textured surfaces with a single layer isolation pattern even though the dried polymer contains ridges at the edges of the line. However, for alkaline surfaces the dried polymer lines, at least at the edges, must be 6-8 µm high for 100% lift-off after 10-15 mins sonication in deionised water at 20-25° C. In addition, for the alkaline textured surfaces the resulting openings in the aluminium layer are in the order of 150-200 µm and therefore larger than necessary for isolation purposes. The use of an alkaline texturing process that results in smaller pyramid sizes (i.e., 1-2 µm high pyramids) can reduce the required polymer line height. Another factor that makes the lift-off more difficult for alkaline textured wafers is the existence of residual saw-damage ridges across the wafers. As many manufacturers seek to reduce their saw-damage etching time to reduce silicon wastage, many commercial-grade mono-crystalline wafers exhibit a wavy ridge pattern across the surface presumably due to residual saw-damage that has not been removed before texturing. This surface pattern can make lift-off unreliable (i.e., less than 100%) depending on the angle of the isolation lines with respect to the inherent waviness on the wafer.

However, these issues with wafer surface can always be addressed by adjusting the height and profile of the printed polymer lines. Printing throughput can be increased by depositing from more than one nozzle at a time. The nozzles can be aligned to be very close to each other so that they slightly increase the width of the printed polymer line (i.e., printed according to an overlapped pattern).

Variation 1

The cell design, depicted in FIG. 1A and described with reference to FIG. 2, involves etching grooves in the heavily-doped n-type and p-type regions of the cell. Variations are possible where point contact openings can be formed in these regions using the patterning approaches such as described in the PCT publication WO 2011/017740 (PCT/AU2010/

001001) entitled "A method for the selective delivery of material to a substrate". Point-contacting schemes have the advantage of further minimizing the metal-silicon contact area and there is little overhead in forming the point contacts with the designs depicted in FIG. 1A and FIG. 1B because the deposition path for the fluoride source can be directed at an angle (e.g., 90 degrees) to that used to deposit the PAA. In this case, etching only occurs at points where both PAA and the fluoride source have been deposited. This means that point contact schemes can be achieved with effectively no additional processing. This presents key advantages over other point contacting schemes (e.g., laser-fired contacts and laser-doped point contacts) where either a mask must be used or individual points of the contacting pattern must be included and "visited" by the patterning tool. Because the point openings in the dielectric layer directly contact heavily-doped silicon, series resistance losses associated with collection of carriers (e.g., spreading and contact resistance) is minimized.

Variation 2

FIG. 1B shows a variation of the preferred cell design shown in FIG. 1A. This design has the advantages that: (i) the rear emitter is lightly-doped resulting in less Auger recombination in the device; and (ii) the n-type contacts which are responsible for collection of the minority carriers are placed closer to the floating junction thus reducing the path length of the minority carrier electrons in the bulk of the wafer. Under illumination the (front) floating junction becomes forward-biased and electrons collected in the n-type region at the surface 115 are injected into the p-type base 110 where they must diffuse to the n-type contacts. The shorter the distance that they must diffuse the lower the probability they will recombine with the majority carrier holes. In the extreme, if the n-type contact regions are extended through the wafer until they contact the front surface junction then an EWT cell results.

The n-type incursions can be grooves or holes and may extend a variable distance into the wafer. In the event grooves are used, if the grooves are too deep then the structural integrity of the wafer will be compromised and wafer breakage rates will increase reducing manufacturing yields.

Figure 5:
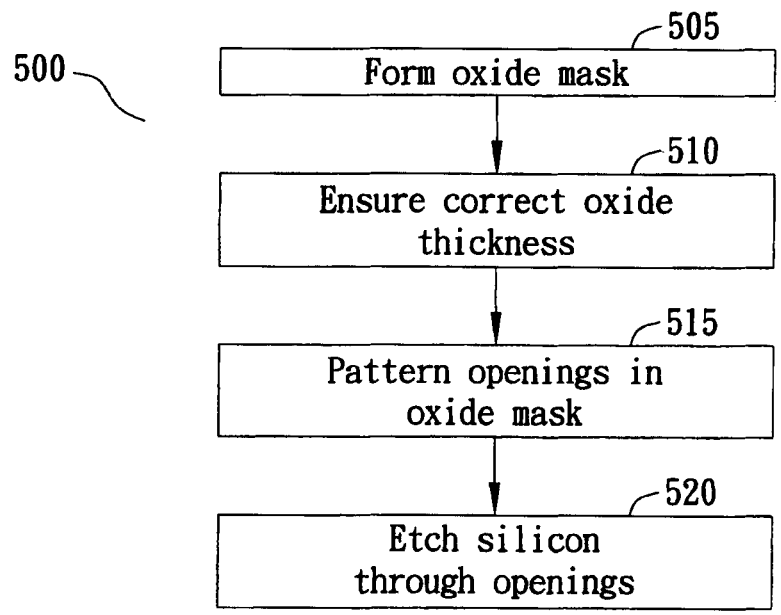
FIG. 5 is a process flow diagram showing the steps for forming a patterned n-type rear emitter for the variation shown in FIG. 1B.

The n-type incursions can be formed using either a laser or by patterned etching substantially as described above for the preferred arrangement. FIG. 5 depicts a patterned etching process 500 for forming these incursions which can be performed between steps 205 and 210 of FIG. 5. In order to achieve heavy-doping at least in the base of the n-type grooves 120, first a masking dielectric of preferably silicon dioxide is either thermally-grown, deposited using a plasma process such as PECVD, or applied as a spin-on-glass layer in step 505. Other dielectric materials, such as silicon nitride, silicon carbide and silicon oxynitride can also be used. Although these layers can densify and lose their passivation properties during the subsequent diffusion step they are not required to be part of the final device and so can be sacrificed after the diffusion process.

The thickness of this masking layer must be carefully controlled (step 510) because it will act as a partial diffusion mask in step 210 enabling light diffusion in all areas where the mask is present and heavy diffusing where it is absence. For a thermally-grown silicon dioxide layer preferably the masking layer is ~90 nm thick. In Step 515 openings are etched as described previously for step 220. The openings can be grooves (e.g., as depicted in FIG. 1A) or holes as described for Variation 1. The silicon is then etched through the openings, substantially as described for step 225 of process 200 to form incursions of the required depth.

When a phosphorus diffusion process is then performed the areas exposed through the grooves will be heavily-doped whilst areas protected by the masking layer will only be lightly doped. The thickness of the masking layer can be used to control the doping level of the underlying silicon regions.

In the variation where a laser is used to form the incursions (that are to become heavily-doped), the laser can be used to ablate the masking layer and form grooves in the underlying silicon. After laser-groove formation, then preferably an etch in solution comprising 12-15% sodium hydroxide is performed for 10-15 mins at 50° C. to remove any silicon that has been damaged during the laser ablation step. This "groove etch", which is substantially the same as that performed for buried contact cells, can also thin the masking layer and so any thinning effects on the mask need to be taken into account when the masking layer is first formed or deposited.

Figure 2:
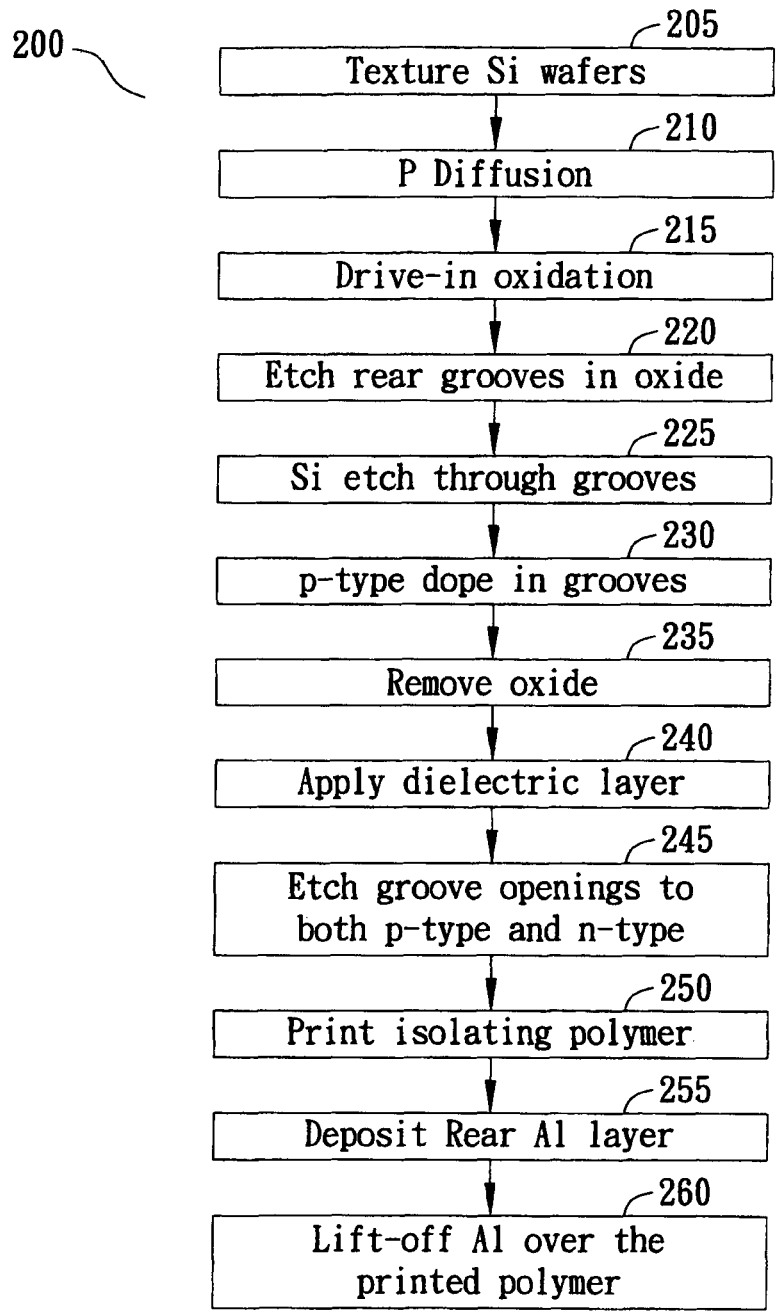
FIG. 2 is a process flow diagram showing the basic steps for fabricating the rear contact cell design of FIG. 1A.
Figure 8:
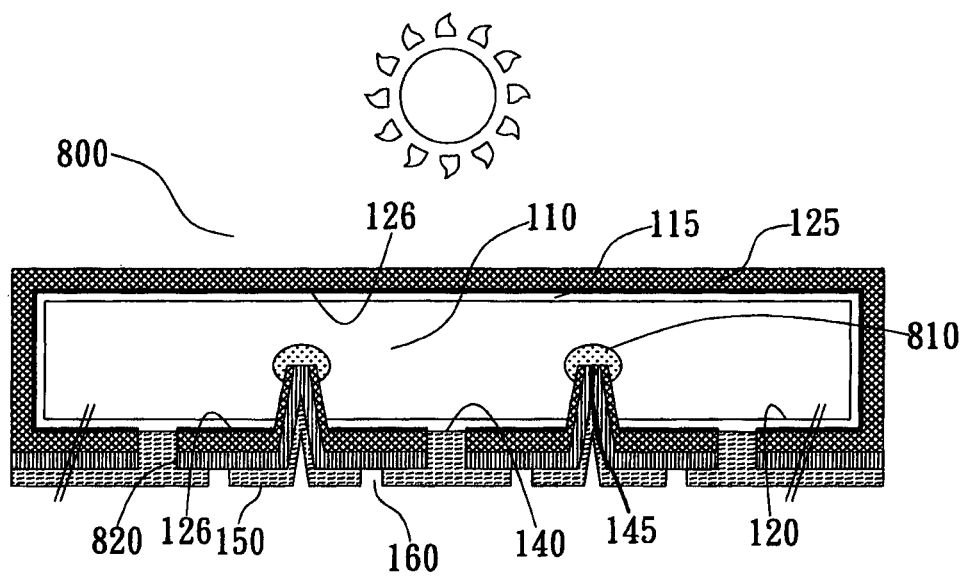
FIG. 8 is a schematic diagram showing a variation of the rear contact cell design of FIG. 1A made by employing the process of FIG. 7.

Fabrication of the cell can then proceed substantially as described by the process flow 200 shown in FIG. 2. Alternatively, for other variations such as depicted in FIG. 8, incursions are not required to be patterned for the p-type contacts. In this variation, contact to heavily-doped p-type regions is achieved by laser-doping through and anodic aluminium oxide layer. In this variation, the drive-in step following the diffusion step 210 does not need to form an oxidation layer for subsequent patterning.

Variation 3

A key to enabling the use of less expensive silicon substrates for cell fabrication is to well-passivate the surfaces of the devices. As previously mentioned, silicon nitride dielectric layers can result in very low surface recombination velocities at n-type Si surfaces due to the presence of stored positive charges which induce an accumulation layer at the silicon interface. In a further variation, a rear-surface dielectric stack comprising a thin layer of silicon nitride (or silicon dioxide, silicon oxynitride, silicon carbide or amorphous silicon) and a subsequent layer of anodic aluminium oxide is used to: (i) further improve the passivation of the rear surface; and (ii) provide enhanced light trapping in the device.

The dielectric stack is formed by first depositing either a silicon nitride, silicon dioxide silicon oxynitride, silicon carbide or amorphous silicon layer on the rear surface of the device by PECVD as described previously for step 240 of process 200. Alternatively, a silicon dioxide layer can be either grown using a thermal oxidation process or also deposited by PECVD. An aluminium layer of thickness 200 to 800 nm and more preferably 500-700 nm is evaporated or sputtered onto the silicon nitride. This layer is anodised substantially as described in PCT application no PCT/AU2011/000586 entitled "Metal contact scheme for solar cells" to form a porous aluminium oxide dielectric layer. Such anodic aluminium oxide (AAO) films formed over an intervening silicon nitride, silicon oxynitride or silicon dioxide layer can enhance the formation a surface accumulation layer for n-type silicon and result in improved passivation.

The dielectric stack can be patterned as described for step 245 of process 200 except for the requirement to deposit additional layers of the fluoride source in order to etch the thicker dielectric layer. The described method of patterned etching can also be used to etch layers of AAO. Although the dielectric stack is thicker than the silicon nitride layer used for the preferred arrangement shown in FIG. 1A, the amount of fluoride ion required to etch the anodic aluminium oxide layer is proportionally less because of the high resulting porosity of the layer (~10% when the layer is anodised using 0.3 M sulphuric acid and an anodisation voltage of 25 V).

Figure 6:
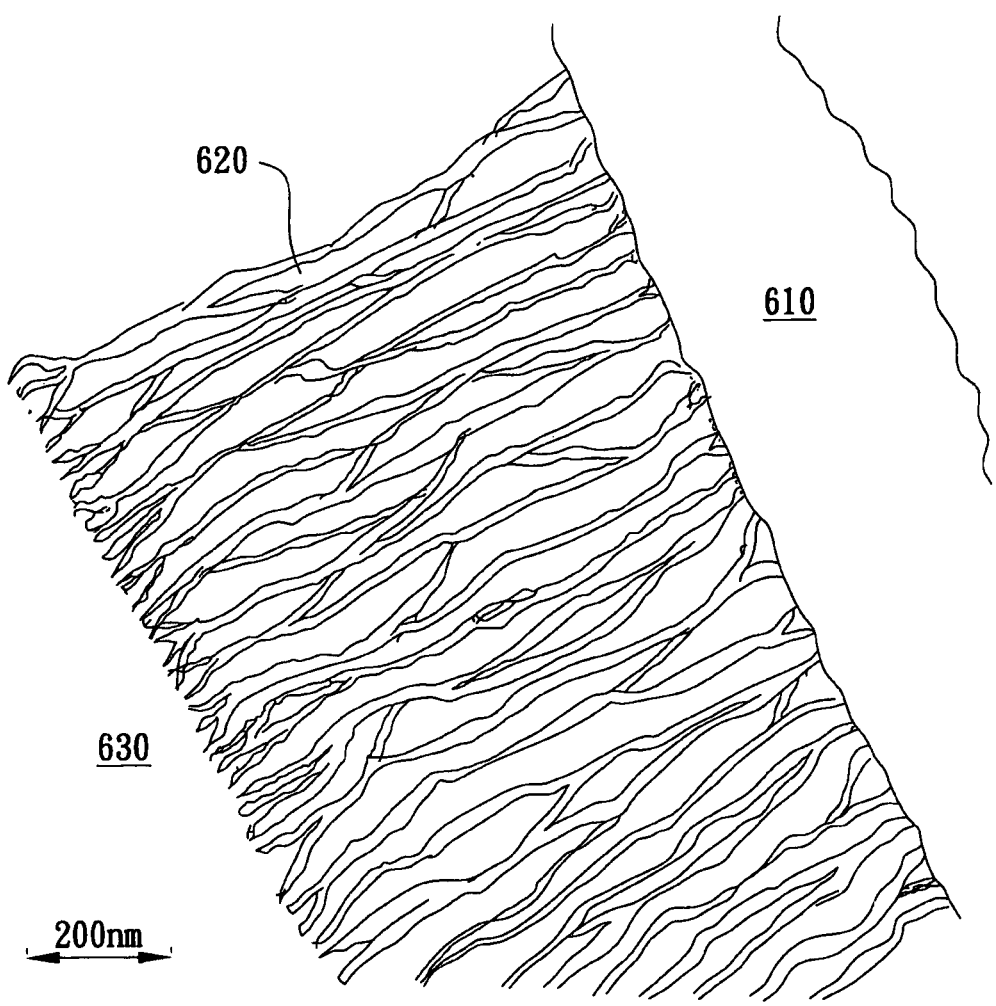
FIG. 6 is an illustration of an anodic aluminium oxide layer with metallised pores.

After patterning, metallization can proceed as per steps 250 to 260 of process 200. As the aluminium is deposited it fills the pores in the AAO as shown in FIG. 6 forming a metal-dielectric structure 620 between the deposited aluminium (610) and intervening silicon-based dielectric (630) that acts to scatter transmitted light back into the cell for absorption. The metal structures in the dielectric serve to couple the light back into the cell at oblique angles which increases the length of the light path and hence the probability of absorption. This light scattering property is advantageous in minimising transmission of light out from the rear surface of the cell in the narrow isolation path regions (i.e., where the rear metal electrode has been removed for isolation purposes using the previously described lift-off method).
Variation 4

Figure 7:
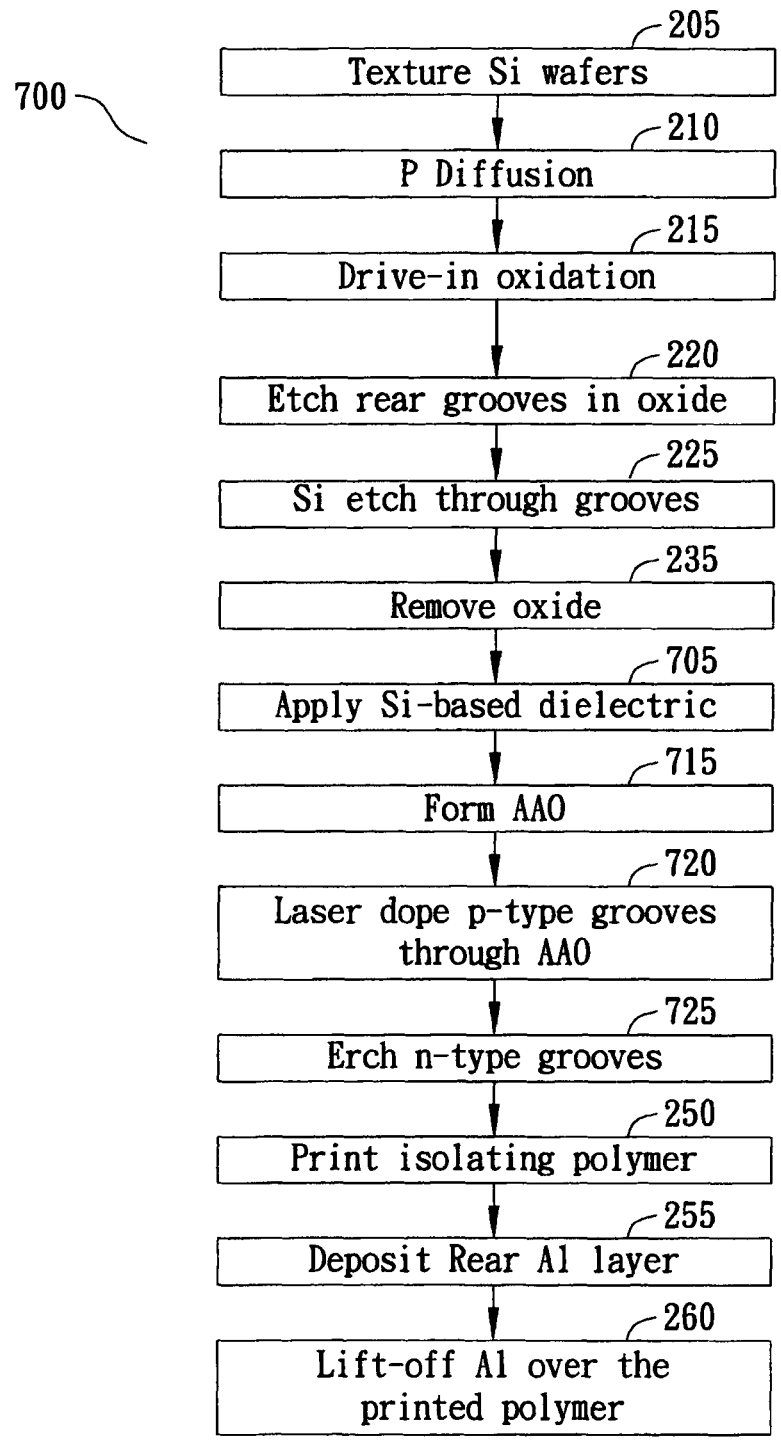
FIG. 7 is a process flow diagram showing a variation of the process depicted in FIG. 2, in which the p+ doping is achieved by laser-doping through an anodic aluminium oxide layer.

A further variation of the preferred arrangement is depicted by the process flow 700 in FIG. 7 and FIG. 8. In this variation the ability of an AAO layer to provide a source of aluminium atoms to heavily-dope the contact regions is exploited. The process 700 proceeds as described for process 200 until the p-type grooves are etched in step 225. Instead of performing the heavy p-type doping at this stage the oxide is removed as described for process 200 in step 235, and then in step 705 the Si-based dielectric of choice (e.g., silicon nitride) is applied to both the front and rear surface of the cell. A different Si-based dielectric can be used for the front and back surface, and the thickness of the layer can be varied between the two surfaces. Preferably the thickness of the front surface layer is maintained at ~75 nm for the dielectric having a refractive index of ~2.0 to minimize reflection from that surface.

An AAO layer 820 is then formed over the entire rear surface in step 715 as described for Variation 3. A laser can then be used to locally-melt and thus heavily-dope the silicon at the base of the grooves in step 720. The presence of the grooves can be clearly identified in an alignment camera attached to laser, with both point and line alignment being performed to ensure that the laser path follows the patterned grooves. A high powered 532 nm laser may be used to perform the doping step. The laser scanning speed may be between 0.1 and 2 m/s, and preferably between 0.5 and 0.6 m/s to minimise formation of defects and to maximise doping in the laser-doped lines. The sheet resistance at the base of the laser-doped grooves is preferably 10-45 $\Omega$/sq, and more preferably 15-25 $\Omega$/sq.

The formation of the p-type heavily-doped regions 810 using local doping from the AAO layer 820 is advantageous because it means that the bulk of the wafer is not exposed to high temperatures which can potentially degrade the minority carrier lifetime and ultimately the performance of final devices. Optionally, an annealing process can be included after the laser-doping step (step 720) to anneal any damage which may have occurred during the laser-doping step. Preferably this annealing is done under forming gas (e.g., 4% $H_2$ in $N_2$ or Ar) at a temperature between 350 and 700° C. and more preferably between 650 and 680° C.

In step 725 openings can be formed to the heavily-doped n-type silicon 140 using the patterned etching process previously described for step 245 of process 200. The thus patterned rear surface can be metallised as described for process 200.

The local doping process can be varied by filling the pores of the porous layer 820 with a material that can alter the resulting local doping of the underlying silicon. For example, a material representing a source of boron atoms such as boric acid can be used to fill the pores before the laser-doping in step 715. Addition of boron dopant atoms in the locally-doped silicon can increase the conductivity of the doped regions 810 and reduce the contact resistance.

Although the process 700 requires further processing equipment (e.g., a laser) and hence a slightly more complicated process, it has a number of advantages. First, by using a local doping technique the wafers are not subjected to a high temperature process to enable the local p+ doping. This enables lower-quality wafers potentially to be used. Furthermore the AAO, which provides a source of dopant atoms for the local p+ doping, also provides enhanced rear-surface passivation and light-trapping properties which enables higher cell efficiencies to be achieved for a similar cost of processing.
Variation 5

Figure 9:
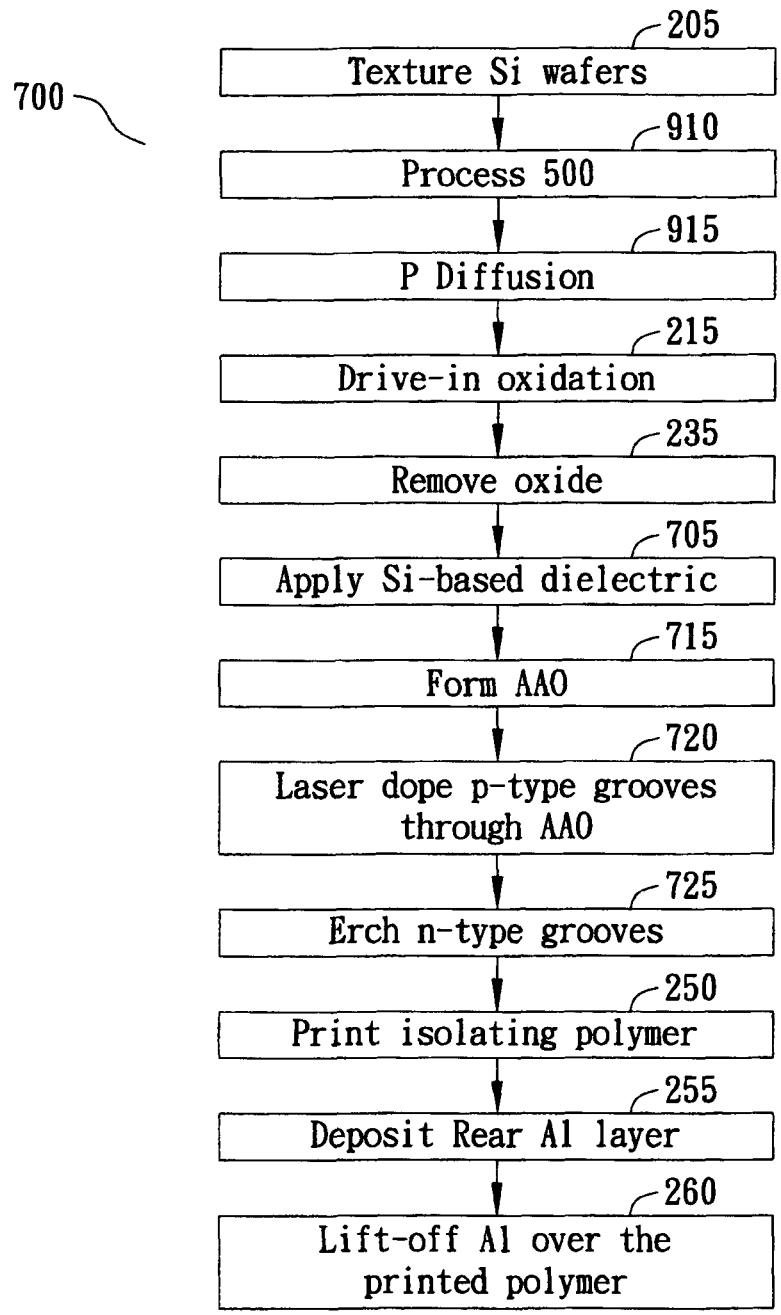
FIG. 9 is a process flow diagram showing a variation of the process depicted in FIG. 7, in which the process of FIG. 5 is also incorporated.
Figure 10:
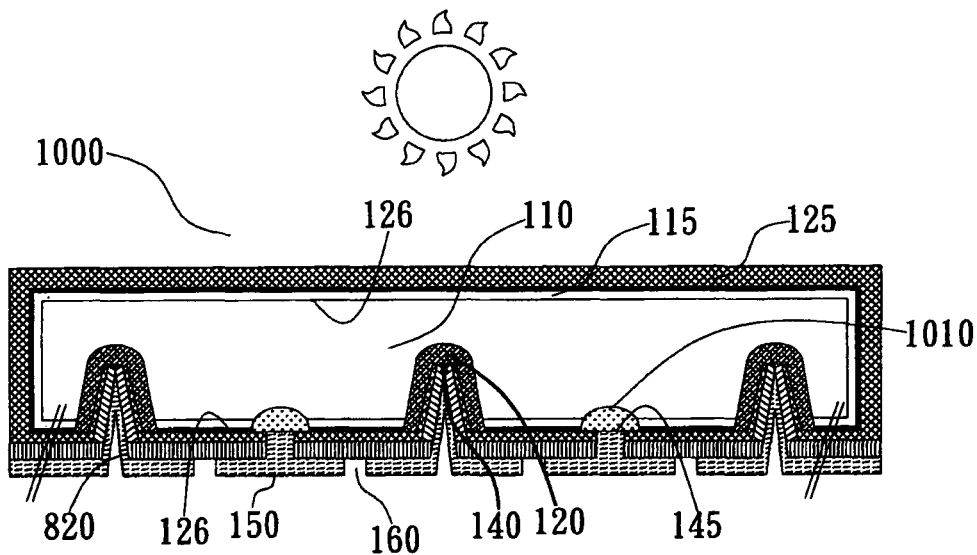
FIG. 10 is a schematic diagram showing a variation of the rear contact cell design of FIG. 1A made by employing the process of FIG. 9.

The AAO dielectric structure can be used for alternative cell designs such as depicted in FIGS. 9 & 10 which are a variation of the cell design depicted in FIG. 1B. The process flow 900 shown in FIG. 9 is used to fabricate this alternative cell design. In this variation the process proceeds as described for process 500 to result in a masking oxide layer which results in heavily-doped n-type regions at the exposed bases of the rear surface grooves after the diffusion process in step 910 and the drive-in oxidation (step 215) which is performed as described for the process 200. As an oxide layer is not required for subsequent patterning as described for process 200, the drive-in process does not need to result in the formation of an oxide layer. Alternatively, as described with respect to Variation 2, groove or point incursions can also be created using a laser.

The masking oxide is then removed in step 235 and the rear dielectric layer, preferably comprising a Si-based dielectric 125 and an AAO layer 810, is formed as described for process 700. Heavily-doped contact to the base of the cell 1000 can be formed by using the laser to pattern and simultaneously dope through the rear dielectric layer forming heavily-doped p-type regions 1010 at the rear surface. The rear surface emitter is relatively lightly-doped resulting in sheet resistances between 100 and 500 $\Omega$/sq and more preferably 150-200 $\Omega$/sq on the rear surface after the diffusion process in step 910, and so minimal shunting occurs between the n-type rear surface emitter and the subsequently formed p-type metal contacts. The process then continues as described for process 200.

Fabrication processes such as described for Variation 5 are advantageous for very thin substrates such as made possible by lift-off methods where ultra thin silicon cells are released onto and supported by flexible substrates. In these processes typically the structuring (i.e., patterning of diffused areas) for the cell is performed whilst the silicon is supported by a re-useable substrate. The patterned cells can then be released onto a flexible substrate and be interconnected to other similarly thin patterned wafers to form a flexible module. In these variations the presence of the AAO layer provides enhanced light trapping which is critical for such thin wafers.
Variation 6

The p-type metal contacting scheme described above with respect to FIG. 9 and FIG. 10 can also be applied to cell designs having a front surface n-type emitter and front-surface n-type metal contacts, for example as employed by standard screen-printed solar cells and the many variants of selective-emitter silicon solar cells that are currently being manufactured. In this variation there is no need for the rear-surface patterning processes associated with the n-type contact because these contacts are now formed on the front (illuminated) surface of the solar cell. Although cell designs such as these experience shading losses due to the presence of the front metal contacts, the front-surface emitter provides for efficient capture of minority carriers because these carriers no longer need to traverse the effective width for the cell for capture. Consequently lower-quality wafers can be used thus reducing the manufacturing costs and yielding lower $/W manufacturing.

Figure 11:
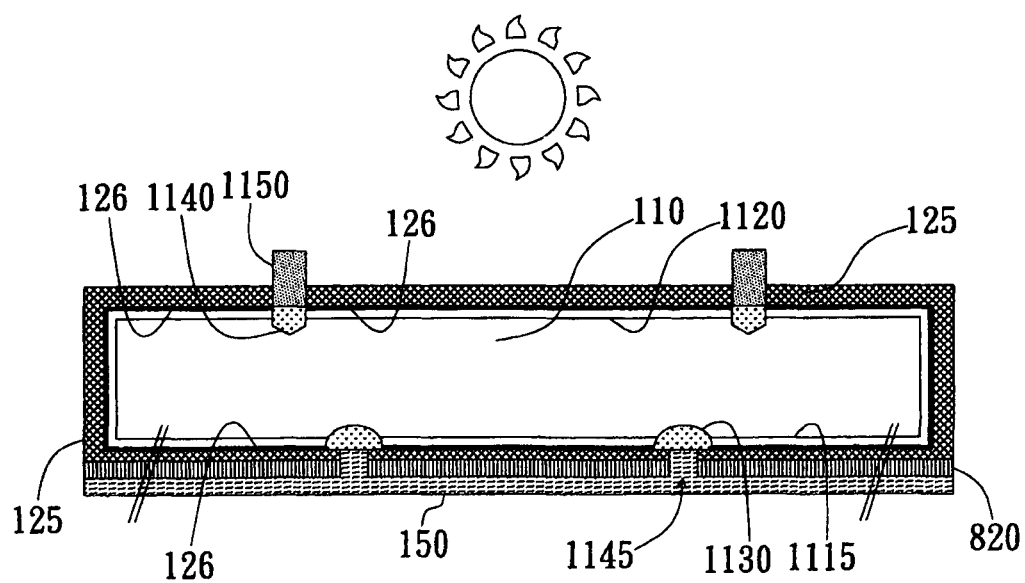
FIG. 11 is a schematic diagram showing a variation of the rear contact cell depicted in FIG. 10 in which both front and rear contacts are employed.

The device shown in FIG. 11 has a front surface emitter 1120 and an optional a rear surface floating junction 1115. The front contact structure comprises heavily doped contact regions 1140 and metallisation 1150 formed by conventional methods, including opening the dielectric layer 125, doping the silicon under the opening to form the heavily doped n-type region 1140 using diffusion or laser doping methods and plating or screen printing the metal contacts 1150. In other respects this variation is similar to the arrangement of FIG. 8 and includes the dielectric stack 126, 125, 820 similar to that illustrated in FIGS. 6 & 8 and the rear p-type contact structure comprising heavily-doped p-type regions 1130 contacted by the rear surface metallisation 150 through holes 1145 in the dielectric stack 126, 125, 820. The grooved structure of the earlier embodiments is not required in this instance because the cell has a front surface emitter 1120.

The device depicted in FIG. 11 has advantages over existing screen-printed or laser-doped selective emitter cells in that the rear surface is well passivated by a dielectric stack containing an AAO layer at all regions except where local contacts 1145 are made to the metal layer 150. This local contacting results in higher open circuit voltages due to reduced recombination at the rear surface. Additionally the AAO layer 820 enhances light trapping in the device thus enabling thinner silicon wafers to be used.

Variation 7

In a final variation, patterns of metallic and insulating/light trapping regions can be formed on a rear surface by patterning a layer of aluminium before anodisation. The patterning can be performed using the "lift-off" method described in process 200. If regions of the aluminium layer are isolated from those aluminium regions contacted by the anodic voltage, then they will remain metallic whilst those regions that are made anodic will form local AAO regions. The isolation of regions of an aluminium layer can also be achieved using the patterned etching method described earlier for steps 220 and 245 of process 200.

This variation is advantageous in that it enables metal contacting, passivation and light trapping to be achieved using a single layer of aluminium. Furthermore, heavily-doped aluminium regions can be formed though openings by firing the patterned aluminium layer after the anodisation process. Anodic aluminium oxide layers can resist temperatures in excess of typical aluminium firing temperatures of 800° C. and consequently can support the formation of aluminium alloyed regions in the metallic regions.

Light trapping in these partially anodised surfaces can be enhanced by filling the porous AAO with dyes that can absorb and re-emit light that escapes from the rear surface of the cell. Alternatively the pores can be filled with reflective materials such as colloids of titanium dioxide particles or similar nanoparticle preparations. These dyes or reflective nanoparticles can be incorporated into polymers used to encapsulate the cells in a module.

This variation can be applied as a rear contact scheme for a cell design such as depicted in FIG. 11 where n-type metal contacts 1150 are formed on the (front) illuminated surface of the cell. Patterned openings can be made to the p-type base of the cell using any of the patterning approaches described for the above variations. Preferably the openings are made to heavily-doped p-type regions to ensure ohmic contacts. Also it is desirable that the area of the silicon exposed via these openings is minimised to reduce recombination at the metal silicon interface. Line or point openings can be made through a dielectric layer, such as silicon nitride, silicon oxynitride, silicon carbide or amorphous silicon.

Figure 13:
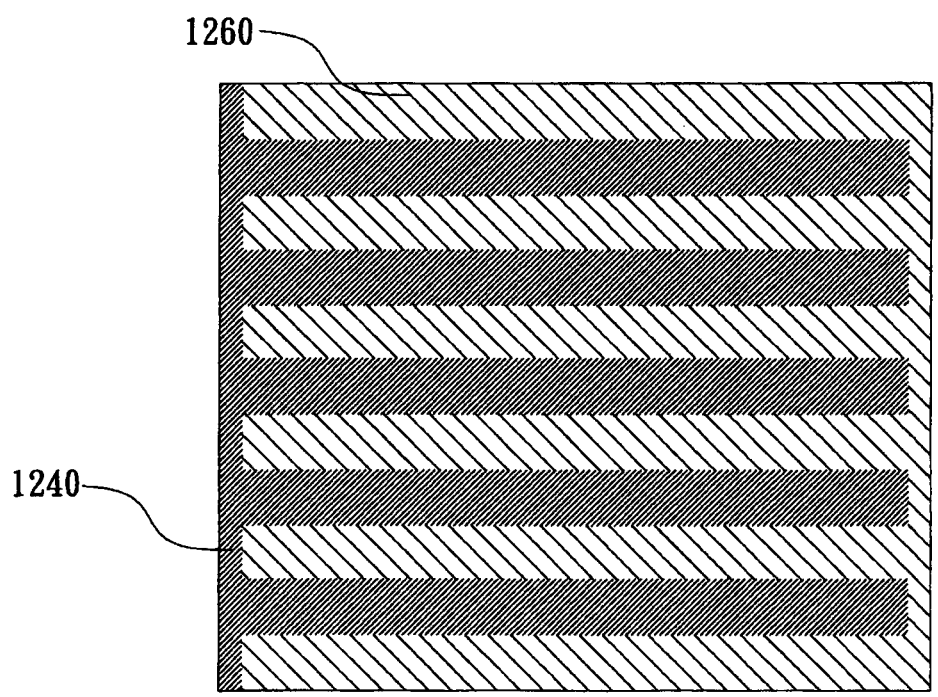
FIG. 13 shows the aluminium layer of FIG. 12 patterned into two electrically isolated regions, one of which has been anodised to form a dielectric region.
Figure 14:
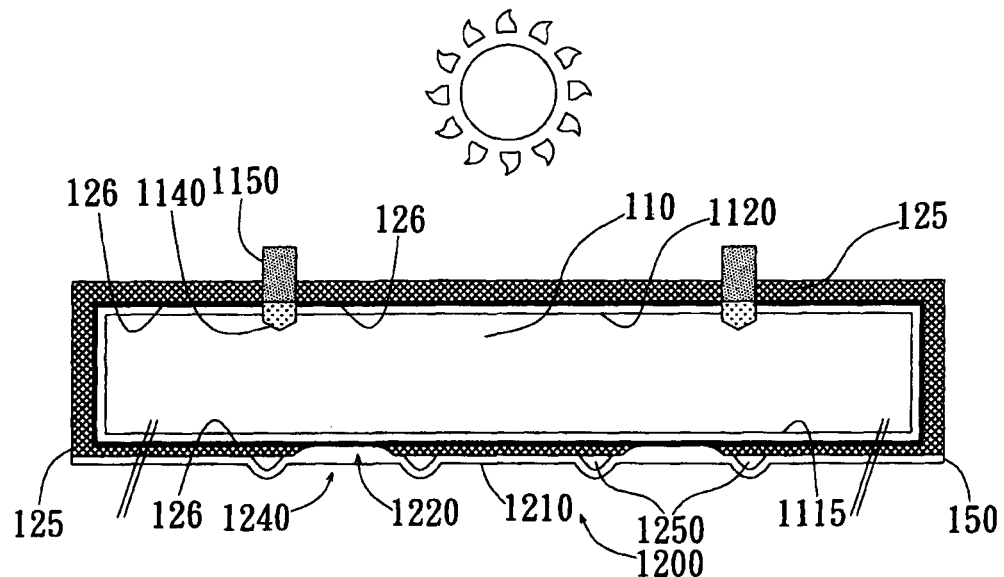
FIG. 14 shows a sectional elevation view of a part of the cell of FIG. 12 before the aluminium 1 is patterned.
Figure 15:
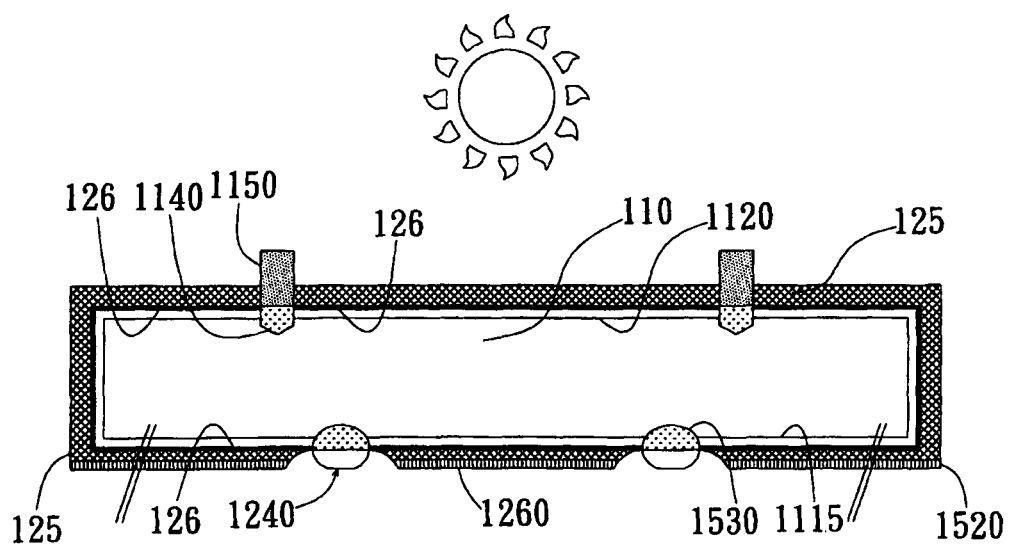
FIG. 15 shows the cell of FIG. 14 after the aluminium is patterned and partially anodized.

A single aluminium layer can then be patterned into metallic and insulating regions using isolating techniques described from process 200. A rear surface 1200 of a cell represented by the schematic in FIG. 11 to which this variation is applied is shown in plan view in FIG. 12 and a sectional elevation view of a part of the cell is shown in FIG. 14. The dashed lines 1220 represent arrays of point openings that have been formed through a rear dielectric layer such as silicon nitride. A linear isolation line 1250 is then deposited as described for step 250 in process 200. The line isolates the region 1210 (i.e., between the linear arrays of openings) from the region 1240 which overlies the openings 1220 in the dielectric layer 125. A layer of aluminium 150 is then deposited over the entire rear surface and "lift-off" is then performed as described in step 260 of process 200 in order to pattern the aluminium layer in to two electrically isolated regions, one of which is subsequently anodized, resulting in the anodized region 1260 and the aluminium contact region 1240 as shown in FIG. 13. A sectional elevation of the cell after anodising and contact doping is shown in FIG. 15.

In order to improve the passivation and light trapping over the region 1210, which does not contact underlying openings in the dielectric layer, that region is connected to the positive terminal of a power supply and anodised as described for step 715 of process 700. This results in the formation of a rear insulating region 1260, that improves both the minority carrier lifetime and light trapping properties of the device. The creation of this insulating region 1260 does not affect the metal region 1240 because it has been isolated from the metal region 1210 during the anodisation process. The metal region 1240 can therefore function as the rear metal electrode for the solar cell.

This patterning of a single aluminium layer 150 into both a metal region 1240 and an insulating region 1260 can also be achieved by printing an etchant for the aluminium according to the pattern 1250. Etchants such as heated phosphoric acid can be readily deposited using printing devices such as inkjet or aerosol printer, however care must to be taken to ensure the etchant does not detrimentally affect the underlying dielectric layer (e.g., silicon nitride).

Figure 12:
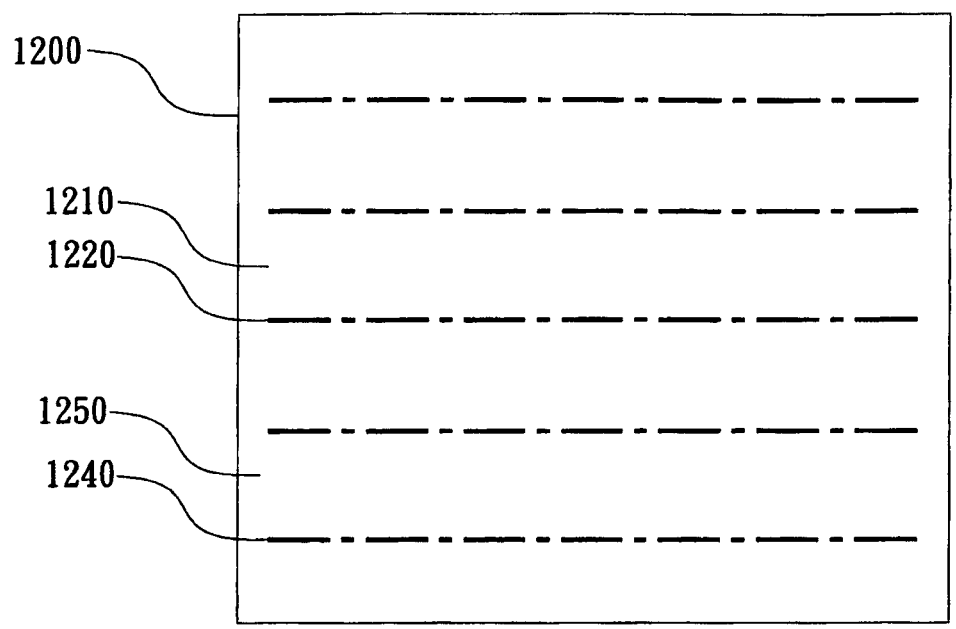
FIG. 12 shows an isolation pattern for forming a single aluminium layer patterned into metallic and insulating regions in a cell similar to that seen in FIG. 11.

In another variation, the need to separately form openings through the dielectric layer (such as the linear array of point openings depicted by 1220 of FIG. 12) is eliminated. In this variation, a thin silicon dioxide layer can be formed over the entire rear surface. Preferably the thickness of the silicon dioxide layer is between 10 and 70 nm thick and more preferably 15-30 nm thick. The isolating line 1250 can then be printed such that it results in narrow fingers in the region 1240 after lift-off. Following the anodisation step to create the insulation region 1260, the cell can be fired as described previously to create aluminium alloyed regions 1530 under the metallic region 1240 (see FIG. 15). This variation eliminates the requirement to deterministically form openings through the dielectric layer to the heavily-doped p-type silicon. Alternatively, the silicon dioxide layer 126 can be replaced by a thin amorphous silicon layer of thickness between 10-50 nm, and more preferably 10-20 nm thick. When aluminium is deposited over the amorphous silicon and heated to temperatures below the eutectic temperature of the silicon-aluminium alloy, silicon and aluminium interdiffuse and on cooling the silicon surface becomes heavily-doped with aluminium. This represents another way in which aluminium contact to heavily-doped regions can be achieved without the need to directly form openings in the dielectric layer. The AAO region 1260 can be formed over the intervening silicon dioxide and amorphous silicon as described previously for silicon nitride intervening layers.

Figure 16:
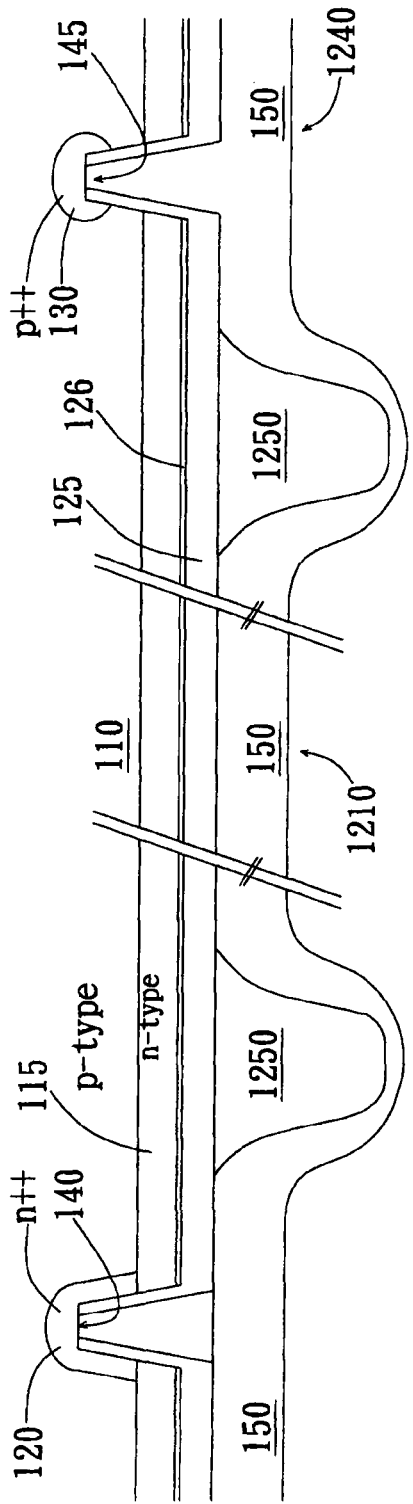
FIG. 16 shows a sectional elevation view of a part of the cell similar to the cell of FIGS. 4C & 4D when employing the single aluminium layer method used in the cell of FIGS. 12 to 15 shown before the aluminium is patterned.
Figure 17:
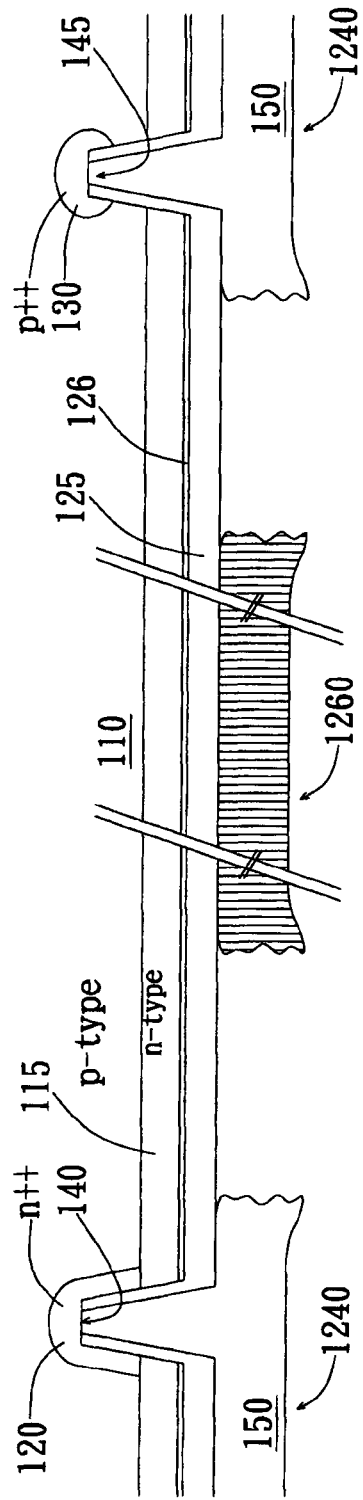
FIG. 17 shows the cell of FIG. 16 after the aluminium is patterned and partially anodized.

As seen in FIGS. 16 & 17 this patterning variation can also be applied to rear contact cells similar to those seen in FIGS. 4A & 4B where metal contacts for both polarities are formed on the rear surface. Isolation patterns which isolate each of the metal electrode regions (of different polarities) from the insulating region can be formed with the width of isolation trenches being as narrow as 100 µm.

Variation 8

Referring to FIGS. 18, 19, 20, 21 & 22 patterns of metallic and insulating/light trapping regions can also be formed from a single layer of metal 1850 by masking regions of the metal layer to remain metallic during the anodising step so that the anodising electrolyte does not contact the masked regions. The metal layer 1850 will preferably be aluminium and the examples described herein will be described with t reference to aluminium but other metals such as titanium, magnesium, zinc, and more precious metals such as niobium and tantalum can also be used to form the metal layer.

Figure 18:
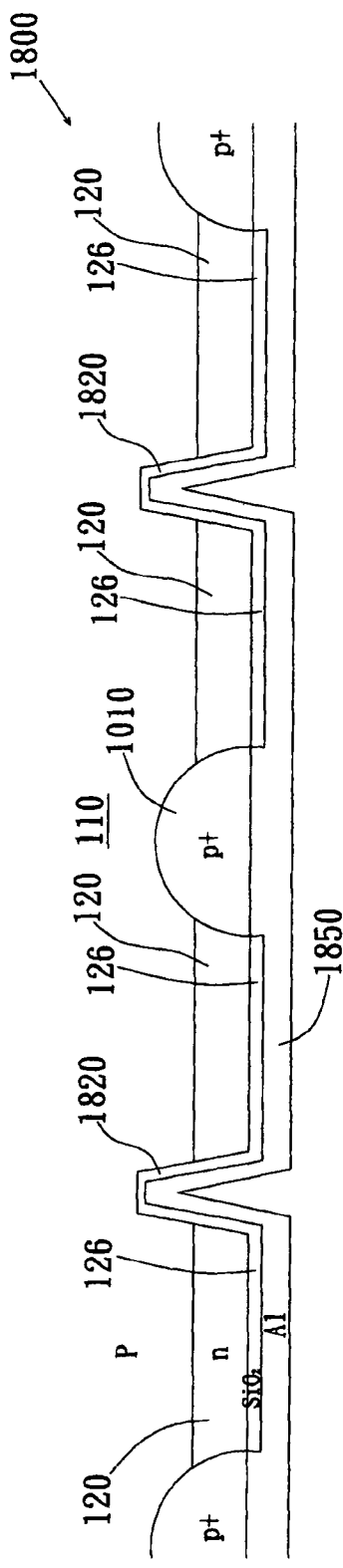

Referring to FIG. 18, the aluminium layer 1850 is seen covering the back surface of the device 1800 and contacting the heavily doped p-type regions 1010 and the heavily doped n-type regions 1820 which are formed by traditional methods such as diffusion or laser doping and respectively provide semiconductor contact regions for the more lightly doped p-type region 110 and the more lightly doped n-type region 120 of the solar cell.

Figure 19:
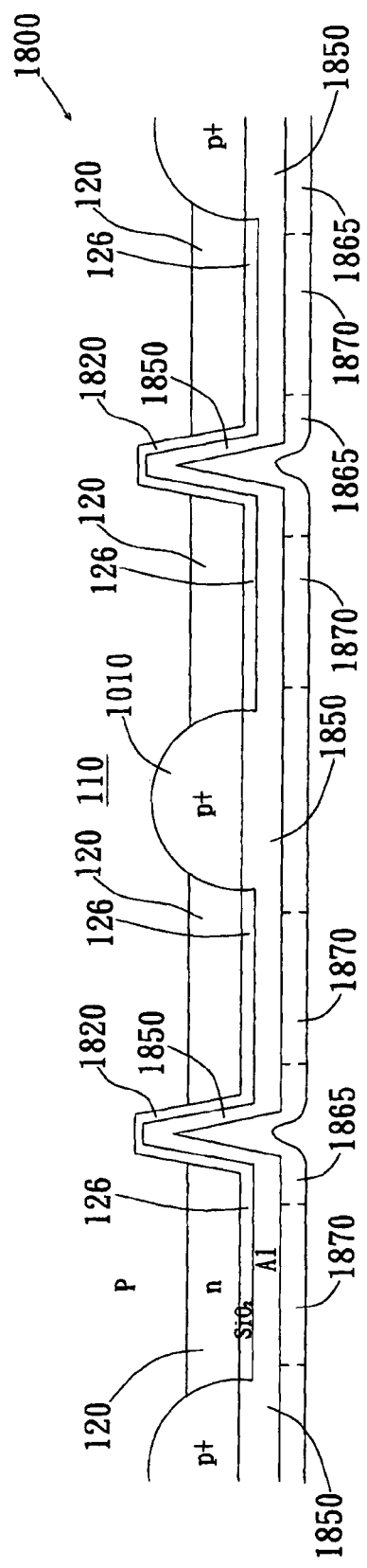

Now turning to FIG. 19 selective masking of regions of the aluminium layer 1850 can be achieved by first forming a layer of acid resistant material (resist) 1865, such as novolac resin, over the entire surface of the aluminium layer 1850 and then selectively removing or modifying the resist 1865 in the regions 1870 where anodisation is required by printing or depositing a fluid that either removes the resistant material or makes it permeable to the acidic electrolyte that will subsequently be used to anodise the metal regions under the resist regions 1870. For resins, such as novolac resin, alkaline solutions such as potassium hydroxide or sodium hydroxide can dissolve and hence remove resist regions. These caustic solutions can be inkjet printed using alkaline resistant printheads such as provided by Konica Minolta, or deposited using an aerosol printer where the solution does not contact and hence damage the deposition tip surface.

Alternatively, resists such as novolac resin can, be made permeable to acid solutions by depositing a plasticiser for the resist, substantially as described in US patent application 20100047721. An advantage of simply making the regions 1870 of resist permeable to the acid electrolyte is that this permeability can be reversed, thus enabling the layer of acid resistant material to form a component of the final device. Resin layers can be formed with light scattering and/or reflective particles.

Figure 20:
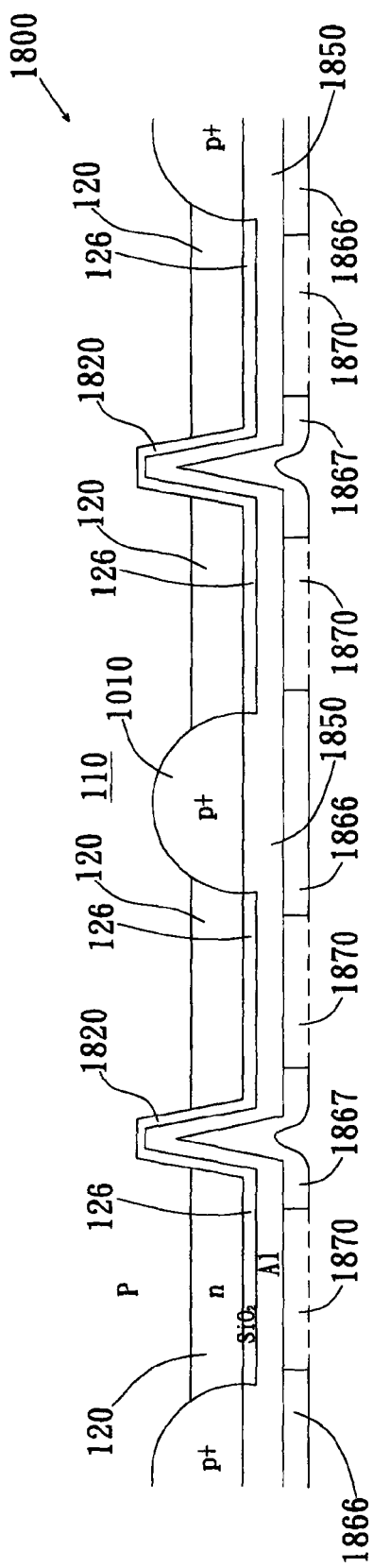

After the resist is processed, it will be as seen in FIG. 20 in which intact resist regions 1866 mask the n-type contact metal and intact resist regions 1867 masking the p-type contact metal. The areas 1870 between the intact resist areas 1866 & 1867 will either be removed or made permeable to allow anodising to proceed in those areas.

Figure 21:
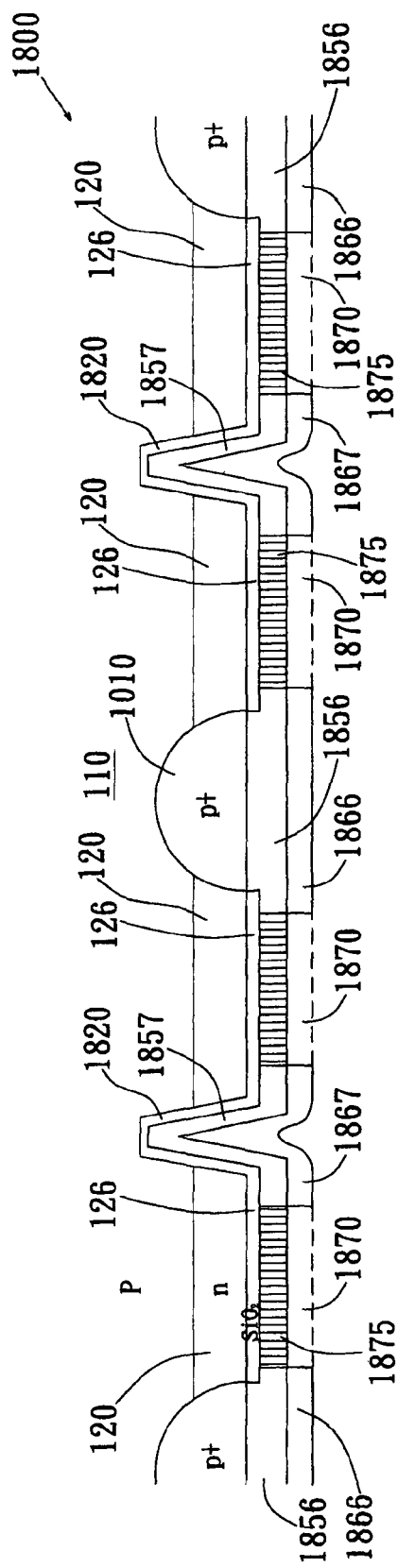

Regions of the dielectric layer can be selectively etched using the method described above for step 220 of process 200. Referring to FIG. 21, after the anodisation process is complete, the aluminium exposed to the anodising solution will be converted to one or more porous oxide regions 1875 which separate the remaining regions of the aluminium layer 1850 into two different contact regions, a first of which becomes a p-type contact metal region 1856 contacting the p-type semiconductor regions 1820 and the other becomes an n-type contact metal region 1857 contacting the n-type semiconductor regions 1010.

In the case where the resist is made permeable in the regions 1870 where anodisation was required, after the anodisation process is complete, the region of resin with colloidal particles 1870 can be reflowed to fill the formed pores in the formed AAO regions 1875 providing an enhanced rear reflector for the solar cell device 1800. The reflow process described in US patent application 20100047721, involving exposing the resistant material to a saturated vapour of the solvent for the resin (e.g., propylene glycol methyl ether acetate for novolac resin), can be used for this purpose.

Selective masking of regions of the aluminium layer 1850 can also be achieved by depositing a masking layer 1865 of an inorganic material such as silicon dioxide, titanium dioxide, aluminium oxide, silicon nitride, silicon oxynitride and silicon carbide, and then selectively etching regions of this layer to expose the surface of the aluminium layer 1850 in the regions 1870 or else by directly depositing these or similar masking materials to protect the metal regions 1856 & 1857 that are not to be anodised. These masking dielectric layers are preferably deposited by PECVD, however other deposition methods such as sputtering or annealing of spin-on-glasses, or localised deposition of the masking material such as by inkjet or screen printing, can be used. Preferably the masking layers are 5 to 100 µM thick and more preferably 60-80 µm thick.

Regions of the dielectric layer can be selectively etched as above using the method described above for step 220 of process 200.

Once the anodisation process has been performed the inorganic dielectric mask can be removed by immersion of the device in an etchant for the dielectric material used for a short time. Because the masking layer is much thinner than the formed AAO regions, it can be removed without significantly etching the formed AAO regions.

Patterns of acid resistant material 1866 & 1867 can also be formed by directly printing or depositing the resistant material over those regions of the aluminium layer 1850 which are not to be anodised (i.e., required to remain metallic). The resistant material can be deposited as described earlier for the isolating resin lines. Alternatively it can be deposited using other printing methods such as screen-printing or inkjet printing. The regions of the aluminium layer 1850 not exposed by the acid resistant material will then be anodised, whilst those regions protected by the resistance material will remain metallic.

Figure 22:
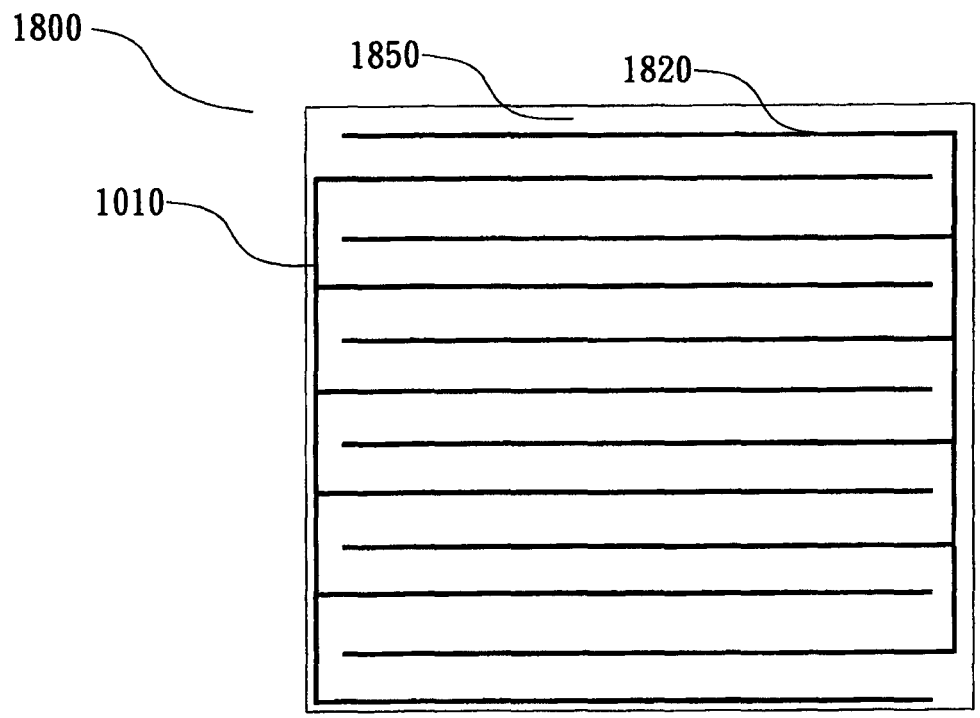

This selective anodisation process can also be used to electrically isolate the n-type and p-type electrodes on the rear surface of devices such as depicted in FIGS. 1A, 1B, 8 and 10 (FIGS. 18, 19, 20, 21 & 22 depict an arrangement similar to that of FIG. 10). Instead of printing isolation lines, as described for the previously described arrangements, masking regions can be formed over the metal regions overlying the contact areas for each of the n-type and p-type contacts. The masking regions can be formed by printing a polymer as described previously for the printing of the polymer lines (step 250 of process 200). FIG. 22 shows the rear surface of a solar cell 1800 where polymer regions 1866 & 1867 have been printed on the aluminium surface 1850 overlying the n-type semiconductor contact regions 1010 and the p-type semiconductor contact regions 1820.

The width of the protected regions 1866 & 1867 can be varied to suit the requirements of the device and the method of extracting the current from the device. For example, in order to extract the current from a commercial-sized rear contact cell it is preferable for the resulting aluminium electrode to form a seed layer and that metal plating processes be used to thicken this seed layer to reduce the resistance in the metal grid. In this case it is, not necessary for the metal fingers 1856 & 1857 to be very wide if 20-30 microns of electroplated copper can be used to thicken the metal grid.

After masking the electrode regions 1866 & 1867 on the rear surface the rear aluminium surface 1850 can be anodised to form an AAO 1875 in the unmasked regions only, which simultaneously passivates the underlying silicon surface in these regions while electrically isolating the metal contact regions 1856 & 1857 of the two semiconductor polarities 110 & 120. After removal of the masking polymer by dissolution in a solvent (e.g., acetone), the electrode regions 1856 & 1857 can be thickened by a plating process. It is difficult to electroplate directly to an aluminium surface, so for this reason preferably a thin zinc layer is formed over the aluminium surface in a process called "zincating". In this immersion plating process a surface layer of aluminium is effectively exchanged with a thin zinc layer from a solution of zinc ions. Zinc is less prone to oxidation than aluminium and hence can be used as a seed layer for a subsequent electroplating process.

During the electroplating process metal (e.g., copper) only plates to the metallic electrode regions 1856 & 1857 of the rear surface and does not plate to the insulating AAO regions 1875. Using electroplating tools the rear grid lines can be thickened to be 20-30 µm thick thus ensuring that fractional power losses due to series resistance losses are maintained below 3% and preferably below 1%. After the metallisation process, the pores of the AAO 1875 can be filled with a reflective filler to enhance the light trapping properties of the insulating regions. The filler can be provided as previously described as part of the rear encapsulating material or the resist material 1870 that was made porous for the anodising step may be used.

A simple variation of the interdigitated contact approach above is to apply it to thin crystalline silicon layers whereby series interconnected devices are formed by having the n-type metal from one cell directly contacting the p-type metal contact from the adjacent cell. Again, both metal contacts including the series interconnection, plus the surface passivating AAO in non-metallised areas, are all formed from the one deposited layer. Electrical isolation through the semiconductor material between adjacent devices is relatively easy to achieve when using thin silicon layers of thickness in the range 1-30 microns. Such layers are not self supporting and therefore have to be processed when bonded to a supporting substrate or superstrate such as glass, increasing the importance of using the described approaches that facilitate single sided processing for both polarities of metal contact.

A further variation of the above is where only the n-type contact in FIG. 22 is formed in the described manner, while the p-type interdigitated contact is subsequently formed by using a laser to scan the region where the p-type contact is to be formed as described for the FIG. 8 variation. The scanning of the laser can be used to simultaneously pattern the AAO layer while using the Al from the AAO layer as a p-type dopant source such that melting the underlying silicon surface allows the Al to be incorporated into the silicon surface to produce an exposed P+ surface in preparation for self-aligned metallisation such as by plating. Such laser doping and self-aligned metallisation processes are well documented elsewhere but with the advantages in this implementation being that firstly the passivating layer provides the dopant source and secondly, the structure of the pores in the AAO layer provide a stress release mechanism that minimises the defect generation within the silicon that is common in such processes due to the thermal expansion coefficient mismatch between the silicon and the overlying dielectric. As previously, following the formation of the interdigitated contacts as described, the remaining AAO layer provides excellent electrical isolation between the two polarities of contacts while also providing excellent surface passivation and also potentially excellent light-trapping in the non metallised regions.

Although this approach has obvious benefits when forming interdigitated contacts of both polarities on the same surface of the wafer or layer of semiconductor, it can similarly be applied to forming a metal contact of either polarity on either surface. For example a wafer with an n-type emitter on the top surface and p-type exposed rear surface of the wafer, can use this approach to form localised n-type contact to the top surface and localised p-type contact to the rear surface by depositing layers of Al onto both surfaces, masking the respective regions that will form the metal contacts, and then simultaneously anodising the remaining unmasked Al on both surface to form well passivated surfaces in the non metallised regions. In this case, the thickness of the top surface layer of Al can be chosen so that after anodisation, it is the right thickness to be an excellent antireflection coating for the cell that achieves its minimum reflectance at a wavelength of about 600 nm. In this way, the anodisation process is used to not only perform the previously described functions, but also to control the transmission and reflection properties of the deposited layer in terms of which regions the light is allowed to pass and with what wavelength bias.

Another example of the implementation of this approach is where localised regions of metal induced crystallisation (MIC) of amorphous silicon (a-Si) are required. Amorphous silicon is known to provide the best quality of surface passivation for crystalline silicon but has limitations in terms of needing to be protected from other materials such as metals that can trigger off changes in the a-Si properties. In the present approach, an a-Si layer can be used instead of the oxide layer 126 to passivate the rear surface of a solar cell 1800 shown in FIGS. 18-22 (or indeed devices using this method when employed in the configurations described for any of the earlier embodiments described herein). The rear surface can be coated with a layer of Al which can then be selectively anodised in regions where the a-Si properties and surface passivation are to be retained. In the masked regions 1856 & 1857 where the metallic properties of the Al are retained, subsequent interaction between the Al and the a-Si such as by heating to a temperature within the range 150-577 deg C., MIC of the a-Si takes place, enabling the formation of a heavily Al (p-type) doped crystalline or polycrystalline silicon region 1010 to be formed at the interface between the Al and the crystalline silicon. Such regions form excellent electrical contact between the remaining Al material and the p-type silicon surface while simultaneously minimising the dark saturation current contribution from the metal/silicon interface by having such regions in only localised areas and by using the newly formed p+ region to shield the interface from the active parts of the device. In the passivated regions, the AAO layer 1875 provides an excellent protective barrier to preserve the properties of the underlying a-Si layer during subsequent metallisation, exposure to various environments and eventually to encapsulation processes and the associated materials used for these purposes. Importantly, the AAO layer can also be used to provide light-trapping for the device as previously described or else by deliberately sizing the pores so that they can be coated during encapsulation or separately, so as to trap air within each pore. The geometry of these pores combined with the excellent transmission properties of the AAO combined with the large percentage of light totally internally reflected at the interface with the trapped air, potentially provides both excellent internal reflection within the silicon as well as excellent light-trapping. An example implementation of this approach is as follows:
1. texture p-type wafer surfaces
2. top surface diffusion with phosphorus
3. rear surface etch to expose p-type rear surface
4. PECVD of 75 nm of SiNx on front surface at 400 deg C.
5. PECVD of 30 nm amorphous silicon onto the rear surface at 200 deg C.
6. Application of phosphoric acid onto front surface followed by laser doping in regions where metal contact formation is required
7. Sputtering or evaporation of aluminium layer onto the rear surface over the a-Si
8. Inkjet deposition of masking material in regions to form the rear metal contact
9. Anodising process to convert non masked regions of the Al layer into anodic aluminium oxide AAO
10. Removal of masking material
11. Thermal treatment at 500 deg C. for 10 minutes for MIC of the a-Si beneath the remaining Al to produce self-aligned p+ silicon at the metal/Si interface
12. Light induced plating of Ni onto the exposed n-type laser doped regions
13. Ni sintering at 375 deg C. for 3 minutes
14. Light induced plating of Cu and silver onto the Ni seed layer Another powerful use of selectively anodising regions of the Al layer is to electrically interconnect separate devices formed on the same substrate. For example, the large majority of a silicon wafer can be used as a solar cell while a small region can be used for the formation of other semiconductor devices such as diodes, transistors, thyristors, resistors and capacitors. Combinations of such devices can be used to form a range of useful circuits such as for the purpose of forming a bypass diode, blocking diode, voltage regulator, maximum power point tracker, DC to DC converter etc. This is not a new concept and such devices can be formed by localised laser doping or masked diffusions etc, but the challenge has always been to find a simple, reliable and low cost way of interconnecting such devices. The present approach of selective anodisation of Al layer allows such device interconnection to occur from the single layer of Al that both interconnects all the devices as required while allowing the anodised regions to provide both passivation of all the non-contacted regions of all devices and excellent electrical isolation between such devices. The outcome is equivalent to the use of a printed circuit board for the interconnection of electronic devices except that in this implementation, it is formed in a simple, reliable, low cost manner that is compatible with the formation and operation of a solar cell.

The method of selective anodisation described in Variation 7 and Variation 8 can be applied more generally to solar cell manufacture where a single layer comprising both conductive and insulating regions is required. As has been described this can be achieved by either:
(i) forming the required pattern in the conductive metal layer and then only electrically contacting the regions to be anodised (i.e., as described in Variation 7); or
(ii) by masking regions of the conductive metal layer that are to remain conductive with an acid resistant material so that the underlying metal does not contact the anodising electrolyte (i.e., as described for Variation 8).

Variation 9

Figure 23:
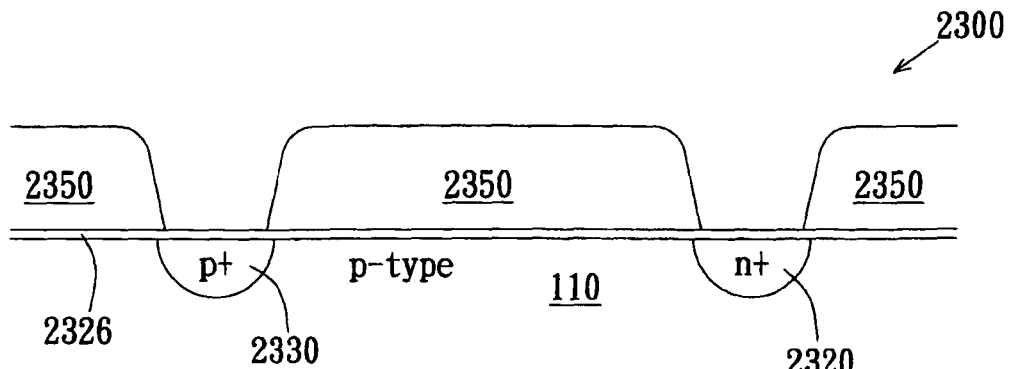

Referring to FIG. 23, an AAO pattern can be formed on a surface of a substrate 110 of a solar cell 2300 by the printing of an aluminium ink 2350 comprising a colloid of aluminium particles in a solvent, optionally over a dielectric layer 2326, such as silicon nitride. The ink can be deposited using a printing device such as an inkjet printer, aerosol printer or a screen printer. Depending on the printing device, the viscosity of the solution can be varied by altering the solvent. Inkjet printing requires the use of a low-viscosity solvent such as ethylene glycol, whereas higher viscosity solvents can be used for aerosol or screen printing. Preferably the aluminium particles in the colloidal ink are capped with an organic capping layer to minimise oxidation of the aluminium.

Figure 24:
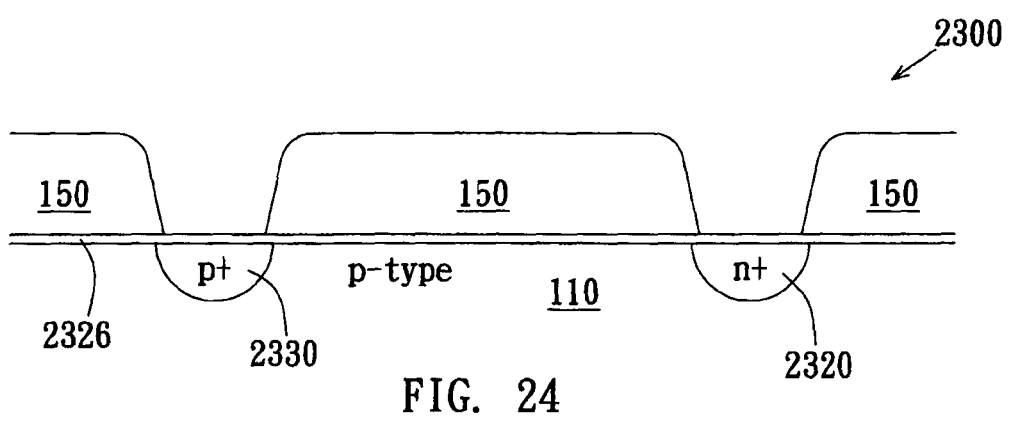

Aluminium colloidal inks, such as provided by companies such as Applied Nanotech can be readily deposited using a pneumatic atomiser of an aerosol printer as described previously. Preferably the particles are less than ~2 um in diameter to ensure reliable and sustained aerosolisation. Wide area aerosol deposition heads, which can deposit over linear regions that are 0.5 to 3 cm wide and more preferably 1-2 cm wide, can be used to increase the throughput of the deposition process and printing speed can be used to control the thickness of the deposited aluminium layer. Once printed, the aluminium layer is sintered at a temperature between 150 and 500° C., and more preferably ~200° C. to remove the capping layer from the particles and form a conductive metal film 150 (see FIG. 24) which can be anodised as described previously. Unlike Variations 7 and 8 where a pattern of metallic and insulating regions are formed of the surface by selective anodisation, this variation results in a pattern of AAO regions on the surface.

Figure 25:
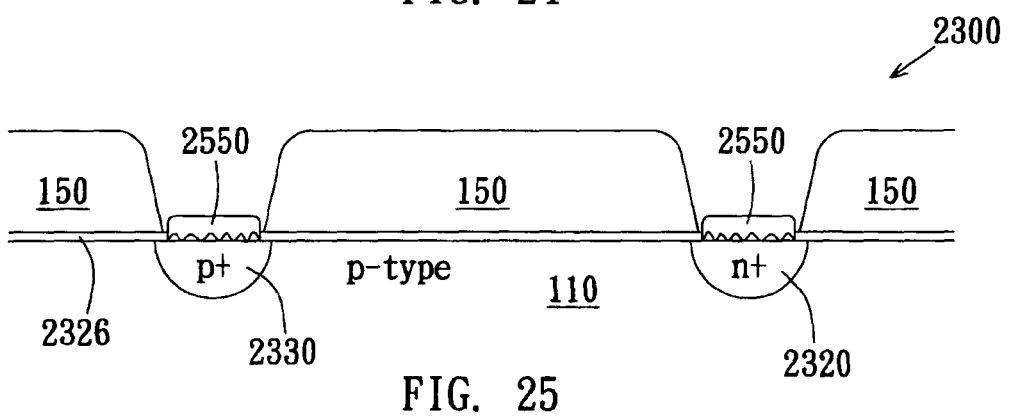
Figure 26:
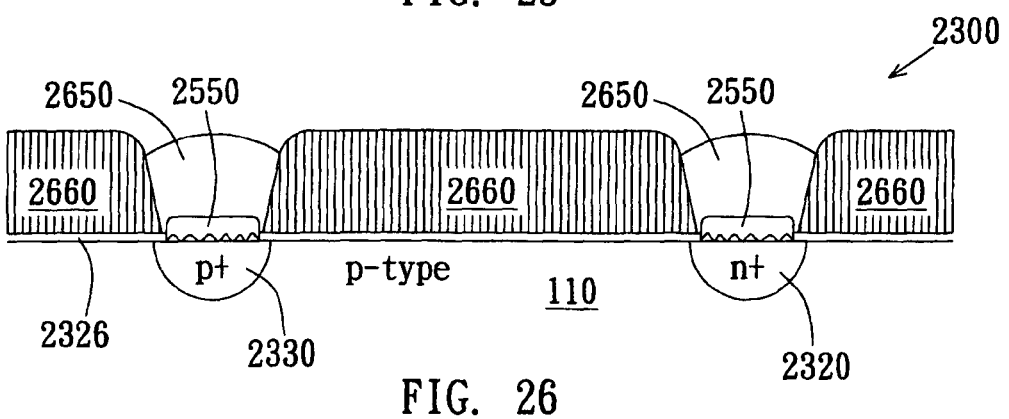

Forming a pattern of AAO on selected areas of a surface can be desirable if aluminium is not the preferred silicon contacting metal. For example, referring to FIG. 25, corrosive nickel inks can be printed to fire through the dielectric layer 2326 (e.g. silicon nitride), to form a seed layer 2550 for plated metal contacts 2650 (see FIG. 26) that lie within gaps in the AAO pattern 2660 to contact the p-type semiconductor contact region 2330 and the n-type semiconductor contact region 2320. The corrosive nickel inks may be applied before the anodising step and fired when firing the printed aluminium ink 2350. Alternatively the corrosive nickel inks may be applied after the anodising step. During a subsequent plating process the AAO regions form a plating mask and can be used to restrain the lateral growth of plated metal deposits 2650.

Alternatively the aluminium ink can be deposited over the entire surface of the solar cell to form a conductive metal layer and then selectively anodised as described for the previously mentioned variations. This method of forming the conductive aluminium layer has advantages over thermal evaporation and sputtering which involve vacuum processes and result in metal wastage as metal deposition cannot be limited to just the cell area.

The invention claimed is:
1. A method of forming an electrical contact for a solar cell device, the method comprising:
a) depositing polymer lines on a surface of the solar cell device;
b) forming a metal layer over the polymer lines and the surface of the device;
c) performing a process to lift-off portions of the metal layer formed over the polymer lines to form a plurality of isolated regions in the metal layer; and
d) selectively anodizing the isolated regions of the metal layer to provide at least one insulating region and at least one metal region, whereby the at least one metal region forms the electrical contact of the solar cell device.

2. The method of claim 1 wherein the polymer is deposited using a printing method comprising one of screen printing, inkjet printing or aerosol printing.

3. The method of claim 1 wherein an anodic potential is applied to a subset of the plurality of isolated metal regions during the selective anodizing, resulting in the at least one insulating region and the at least one metallic region.

4. The method of claim 1 wherein the selective anodizing step forms a plurality of metal regions separated by the at least one insulation region.

5. The method of claim 4 wherein the solar cell device is a rear contact solar cell device and at least one of the plurality of metal regions contacts a p-type semiconductor region of the solar cell device and at least another one of the plurality of metal regions contacts an n-type semiconductor region of the solar cell device.

6. The method of claim 4 wherein the solar cell device comprises a plurality of photovoltaic devices, and at least one of the metal regions is in contact with a p-type semiconductor region of the solar cell device and a n-type semiconductor region of an adjacent solar cell device to create a series connection of the adjacent solar cell devices.

7. The method of claim 1 wherein the metal layer comprises aluminium, titanium, magnesium, zinc, tantalum, or niobium.

8. The method of claim 1 wherein the metal layer comprises aluminium.

9. The method of claim 1, wherein the polymer lines comprise novolac resin dissolved in a high vapor pressure solvent.

10. The method of claim 9, wherein the solvent is sulfolane and the resin is dissolved at a concentration of 1 to 12% (w/v).

11. The method of claim 1, wherein the height of the deposited polymer lines is less than 2 times the thickness of the metal layer.

12. The method of claim 1, wherein the height of the deposited polymer lines is at least 5 times the thickness of the metal layer.

13. The method of claim 1, wherein the polymer lines are water soluble and the processing of the device to lift-off the metal above the polymer lines comprises dissolving the polymer lines using water.

14. The method of claim 13, wherein the water soluble polymer lines comprise polyacrylic acid.

15. The method of claim 13, comprising sonicating the polymer lines in a water bath.

16. The method of claim 1, wherein the processing of the device to lift-off the metal above the polymer lines comprises melting the polymer lines.

17. The method of claim 16, wherein the polymer lines comprise a wax.

* * * * *